US012235331B2

(12) United States Patent
Mori et al.

(10) Patent No.: US 12,235,331 B2
(45) Date of Patent: Feb. 25, 2025

(54) ABNORMALITY DETECTION APPARATUS FOR RESOLVER

(71) Applicant: Mitsubishi Electric Corporation, Tokyo (JP)

(72) Inventors: Tatsuya Mori, Tokyo (JP); Hiroko Ikeda, Tokyo (JP); Kenji Ikeda, Tokyo (JP); Kenta Kubo, Tokyo (JP); Toshihiro Matsunaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 17/794,694

(22) PCT Filed: Feb. 26, 2020

(86) PCT No.: PCT/JP2020/007582
§ 371 (c)(1),
(2) Date: Jul. 22, 2022

(87) PCT Pub. No.: WO2021/171391
PCT Pub. Date: Sep. 2, 2021

(65) Prior Publication Data
US 2023/0055461 A1 Feb. 23, 2023

(51) Int. Cl.
*G01R 31/72* (2020.01)
*G01B 7/30* (2006.01)

(52) U.S. Cl.
CPC .............. *G01R 31/72* (2020.01); *G01B 7/30* (2013.01)

(58) Field of Classification Search
CPC .................................. G01R 31/72; G01B 7/30
See application file for complete search history.

(56) References Cited

U.S. PATENT DOCUMENTS

2006/0273247 A1 12/2006 Sakamaki et al.
2010/0045227 A1 2/2010 Ura et al.
(Continued)

FOREIGN PATENT DOCUMENTS

EP 2 159 548 A2 3/2010
JP 09-72758 A 3/1997
(Continued)

OTHER PUBLICATIONS

International Search Report of PCT/JP2020/007582 dated Jun. 23, 2020 [PCT/ISA/210].
(Continued)

*Primary Examiner* — Reena Aurora
(74) *Attorney, Agent, or Firm* — Sughrue Mion, PLLC

(57) ABSTRACT

To provide an abnormality detection apparatus for resolver which can determine the abnormality of at least the first system, even if the period of the excitation AC voltage of the first system and the period of the excitation AC voltage of the second system are different periods, and the magnetic interference between systems occurs. An abnormality detection apparatus for resolver applies an AC voltage of a first period to a first system excitation winding; applies an AC voltage of a second period different from the first period to a second system excitation winding; calculates a first system square sum which is a sum of square values of the detection values of output signals of first system two output windings after the second period component reduction processing: and determines abnormality of first system based on whether or not the first system square sum is within a normal range of first system.

12 Claims, 16 Drawing Sheets

(56) References Cited

U.S. PATENT DOCUMENTS

| | | | | |
|---|---|---|---|---|
| 2013/0264915 A1* | 10/2013 | Suzuki | ................ | H02K 11/215 |
| | | | | 310/68 B |
| 2019/0039645 A1* | 2/2019 | Kuwahara | ................ | G01D 5/14 |
| 2020/0363233 A1 | 11/2020 | Ikeda et al. | | |
| 2023/0194313 A1* | 6/2023 | Mori | ................ | G01D 5/24476 |
| | | | | 324/76.11 |

FOREIGN PATENT DOCUMENTS

| | | |
|---|---|---|
| JP | 2000-018968 A | 1/2000 |
| JP | 2005-147791 A | 6/2005 |
| JP | 2006-177750 A | 7/2006 |
| JP | 2006-335252 A | 12/2006 |
| JP | 2012-098188 A | 5/2012 |
| JP | 2013-257284 A | 12/2013 |
| WO | 2019/123592 A1 | 6/2019 |

OTHER PUBLICATIONS

Extended European Search Report issued Mar. 6, 2023 in European Application No. 20922332.0.
Office Action dated Sep. 13, 2022 from the Japanese Patent Office in JP Application No. 2022-502632.
Chinese Office Action dated Sep. 14, 2024 in Application No. 202080096633.0.

* cited by examiner

ABNORMALITY DETECTION APPARATUS FOR RESOLVER

CROSS REFERENCE TO RELATED APPLICATIONS

This application is a National Stage of International Application No. PCT/JP2020/007582 filed on Feb. 26, 2020.

TECHNICAL FIELD

The present disclosure is related with an abnormality detection apparatus for resolver.

BACKGROUND ART

As the angle detection device which detects the rotational angle of the motor, the resolver is used well. Although the resolver is known as the robust angle detection device, the resolver is also required for redundancy from the request of the fault tolerance of the motor drive system.

Then, the patent document 1 discloses the dual system resolver which is provided with the first system excitation winding and output winding, and the second system excitation winding and output winding.

The patent document 2 discloses the technology that the first and the second resolver sensors are provided, and it is determined that signal wires of both resolvers short-circuited, when the amplitude sin ωt of the output signal of sine phase and the amplitude cos ωt of the output signal of cosine phase do not satisfy the relation of $(\sin \omega t)^2 + (\cos \omega t)^2 = 1$ about each resolver sensor.

Although it does not have redundancy, the patent document 3 discloses the technology that, in the angle detection device which outputs the sine wave signal and the cosine wave signal according to the rotor position of a brushless DC motor, failure of the angle detection device is detected based on whether or not the sum of each square value of the sine wave signal and the cosine wave signal becomes within the predetermined range.

CITATION LIST

Patent Literature

Patent document 1: JP 2000-18968 A
Patent document 2: JP 2005-147791 A
Patent document 3: JP 2006-335252 A

SUMMARY OF INVENTION

Technical Problem

However, in the redundant system resolver like the patent document 1 and 2, even if electrically insulated between the first system and the second system which configure the redundant system, a magnetic interference occurs. Accordingly, in the output signal of the output winding in one of the first system and the second system, a component resulting from the excitation AC voltage in the other of the first system and the second system is included. For example, in the output signal of the output winding in the first system, in addition to the component resulting from the excitation AC voltage applied to the first system excitation winding, the component resulting from the excitation AC voltage applied to the second system excitation winding is included. Similarly, also in the output signal of the output winding in the second system, in addition to the component resulting from the excitation AC voltage applied to the second system excitation winding, the component resulting from the excitation AC voltage applied to the first system excitation winding is included.

The patent document 1 does not disclose the technology of determining the abnormality of each system, in this kind resolver which has the first system and the second system. The patent document 3 does not disclose the technology of determining the abnormality of each system, in the redundant system resolver.

In the technology of patent document 2, the phases of the output signals of the sine phase and the cosine phase of the first resolver, and the phases of the output signals of the sine phase and the cosine phase of the second resolver are different 180 degrees. The period of the AC voltage applied to the excitation winding of the first resolver, and the period of the AC voltage applied to the excitation winding of the second resolver are made the same periods. Accordingly, in the patent document 2, although the influence of the magnetic interference between the first system and the second system is not indicated, even if the magnetic interference occurs, the component resulting from the excitation winding of the first resolver and the component resulting from the excitation winding of the second resolver, which are included in the output signals of the sine phase and the cosine phase of the first resolver, become inverse phases. Accordingly, the amplitude gains of the output signals of the sine phase and the cosine phase only decrease, but the relation of $(\sin \omega t)^2 + (\cos \omega t)^2 = 1$ is maintained.

Therefore, like the technology of the patent document 2, if the period of the AC voltage applied to the first system excitation winding and the period of the AC voltage applied to the second system excitation winding are the same periods, and the phases of the first system two output signals and the phases of the second system two output signals become the same phases or inverse phases, even if the magnetic interference between systems occurs, it is thought that abnormality can be determined based on the square sum of two output signals, about each system.

However, if the period of the AC voltage applied to the first system excitation winding and the period of the AC voltage applied to the second system excitation winding are different periods, as mentioned above, due to the component resulting from the excitation AC voltage of the second system included in the first system two output signals, the relation of $(\sin \omega t)^2 + (\cos \omega t)^2 = 1$ is not established, and the vibration component of the period of the excitation AC voltage of the second system is superimposed on the square sum of the first system two output signals. Accordingly, based on the square sum, abnormality of first system cannot be determined with good accuracy. Similarly, based on the square sum of the second system two output signals, abnormality of second system cannot be determined with good accuracy.

In order to improve redundancy, it is required to provide a resolver in which the first system and the second system can be operated independently with each other, the synchronization between the excitation AC voltage of the first system and the excitation AC voltage of the second system is not required, and the period of the excitation AC voltage of the first system and the period of the excitation AC voltage of the second system are different periods.

Then, the purpose of the present disclosure is to provide an abnormality detection apparatus for resolver which can determine the abnormality of at least the first system, even if the period of the excitation AC voltage of the first system and the period of the excitation AC voltage of the second system are different periods, and the magnetic interference between systems occurs.

Solution to Problem

An abnormality detection apparatus for resolver according to the present disclosure including:

a resolver that is provided with a first system excitation winding, first system two output windings, a second system excitation winding, and second system two output windings, in which magnetic interference occurs between a first system and a second system;

a first system excitation unit that applies AC voltage of a first period to the first system excitation winding;

a second system excitation unit that applies the AC voltage of a second period different from the first period, to the second system excitation winding;

a first system output signal detection unit that detects periodically output signals of the first system two output windings at preliminarily set detection timing;

a first system reduction processing unit that performs a second period component reduction processing which reduces component of the second period, to detection values of the output signals of the first system two output windings;

a first system square sum calculation unit that calculates a first system square sum which is a sum of square values of the detection values of output signals of first system two output windings after the second period component reduction processing; and a first system abnormality detection unit that determines abnormality of first system, based on whether or not the first system square sum is within a preliminarily set normal range of first system.

Advantage of Invention

According to the abnormality detection apparatus for resolver of the present disclosure, even if the first period and the second period are different, and the components of the second period resulting from the excitation AC voltage of the second period of the second system due to the magnetic interference between systems are included in the detection values of output signals of first system two output windings, the components of the second period can be reduced from the detection values of output signals of first system two output windings, by the second period component reduction processing. Then, since the first system square sum which is a sum of square values of the detection values of output signals of first system two output windings after the second period component reduction processing is calculated, it can be suppressed that the vibration component of the second period is superimposed on the first system square sum. Accordingly, the abnormality of first system can be determined with good accuracy, based on whether or not the first system square sum is within the normal range of first system.

DETAILED DESCRIPTION OF THE EMBODIMENTS

1. Embodiment 1

Figure 1:
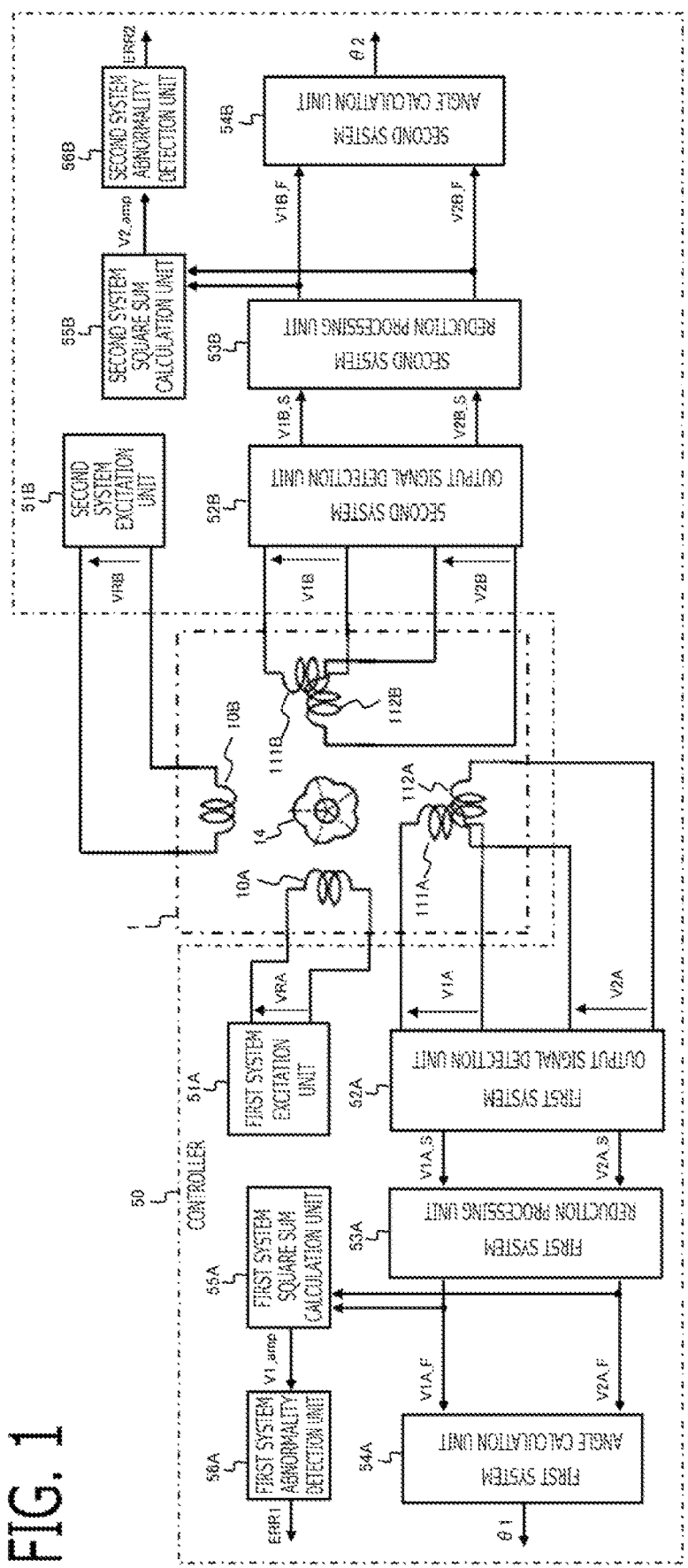
FIG. 1 is a schematic configuration diagram of the abnormality detection apparatus for resolver according to Embodiment 1.

An abnormality detection apparatus for resolver according to Embodiment 1 is explained with reference to drawings. FIG. 1 is a schematic configuration diagram of the abnormality detection apparatus for resolver according to the present embodiment. The abnormality detection apparatus for resolver is also an angle detection apparatus.

1-1. Resolver 1

The resolver 1 is provided with a first system excitation winding 10A, first system two output windings 111A, 112A (referred to also as a first system first output winding 111A and a first system second output winding 112A), a second system excitation winding 10B, and second system two output windings 111B, 112B (referred to also as a second system first output winding 111B and a second system second output winding 112B). A magnetic interference occurs between the first system windings and the second system windings. That is to say, by electromagnetic induction due to the magnetic flux generated by the first system excitation winding 10A, an induced voltage is generated not only in the first system two output windings 111A, 112A, but also in the second system two output windings 111B, 112B; and by electromagnetic induction due to the magnetic flux generated by the second system excitation winding 10B, an induced voltage is generated not only in the second system two output windings 111B, 112B, but also in the first system two output windings 111A, 112A.

Figure 2:
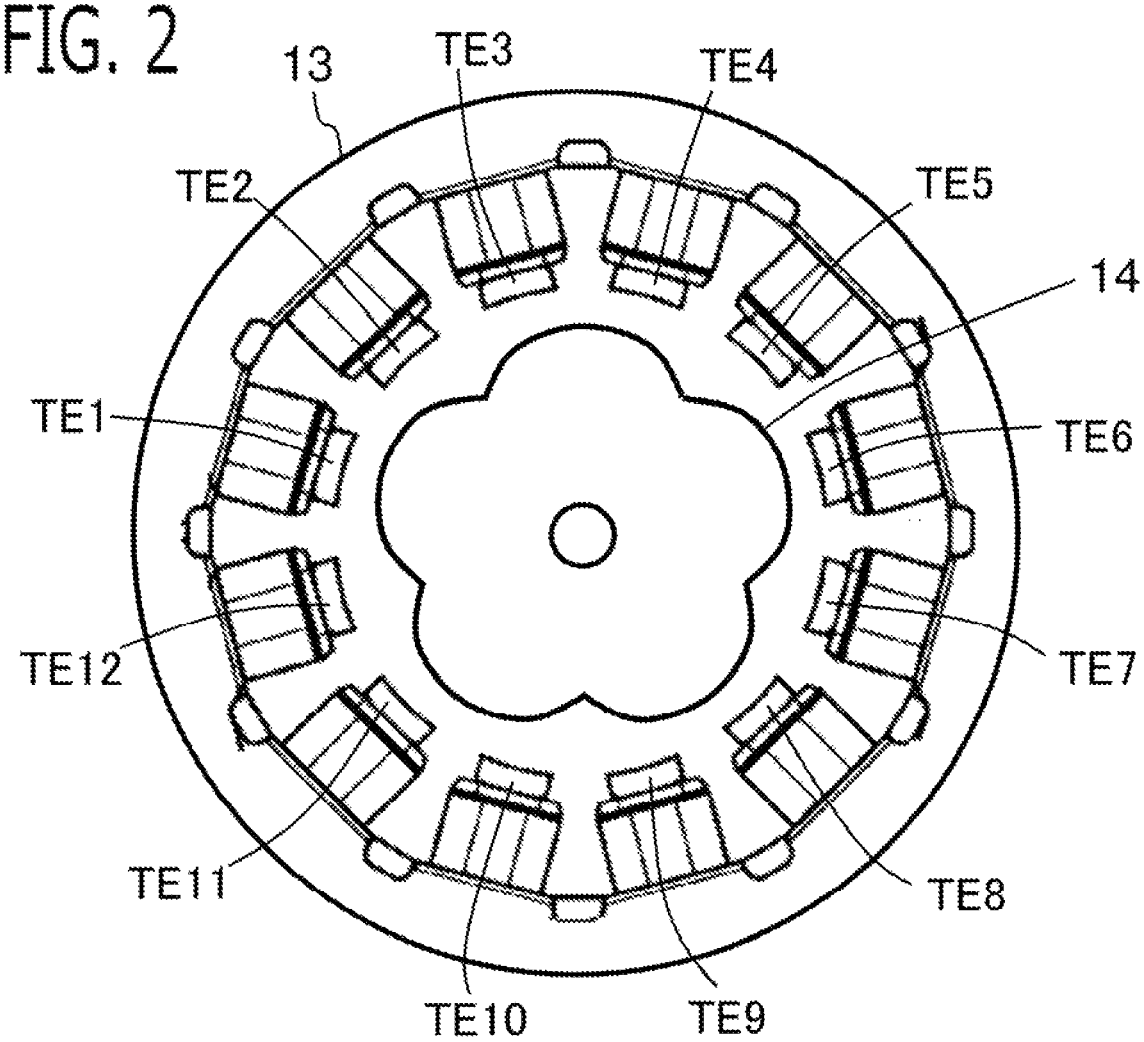
FIG. 2 is a side view of the resolver viewed in the axial direction according to Embodiment 1.

As shown in FIG. 2, the first system excitation winding 10A, the first system two output windings 111A, 112A, the second system excitation winding 10B, and second system two output windings 111B, 112B are wound around the same one stator 13. The rotor 14 is arranged in the radial-direction inner side of the stator 13. The rotor 14 is provided with a plurality of projection parts which are arranged equally in the circumferential direction on the peripheral part of the rotor. The projection height to the radial-direction outside of the projection parts is formed so that the gap permeance between the stator 13 and the rotor 14 changes in sine wave shape according to rotation. That is to say, the resolver 1 is a variable reluctance (VR) type resolver. In the present embodiment, the five projection parts are provided, and the shaft angle multiplier is 5. Therefore, whenever the rotor rotates once in the mechanical angle, rotates 5 times in the electrical angle.

Figure 3:
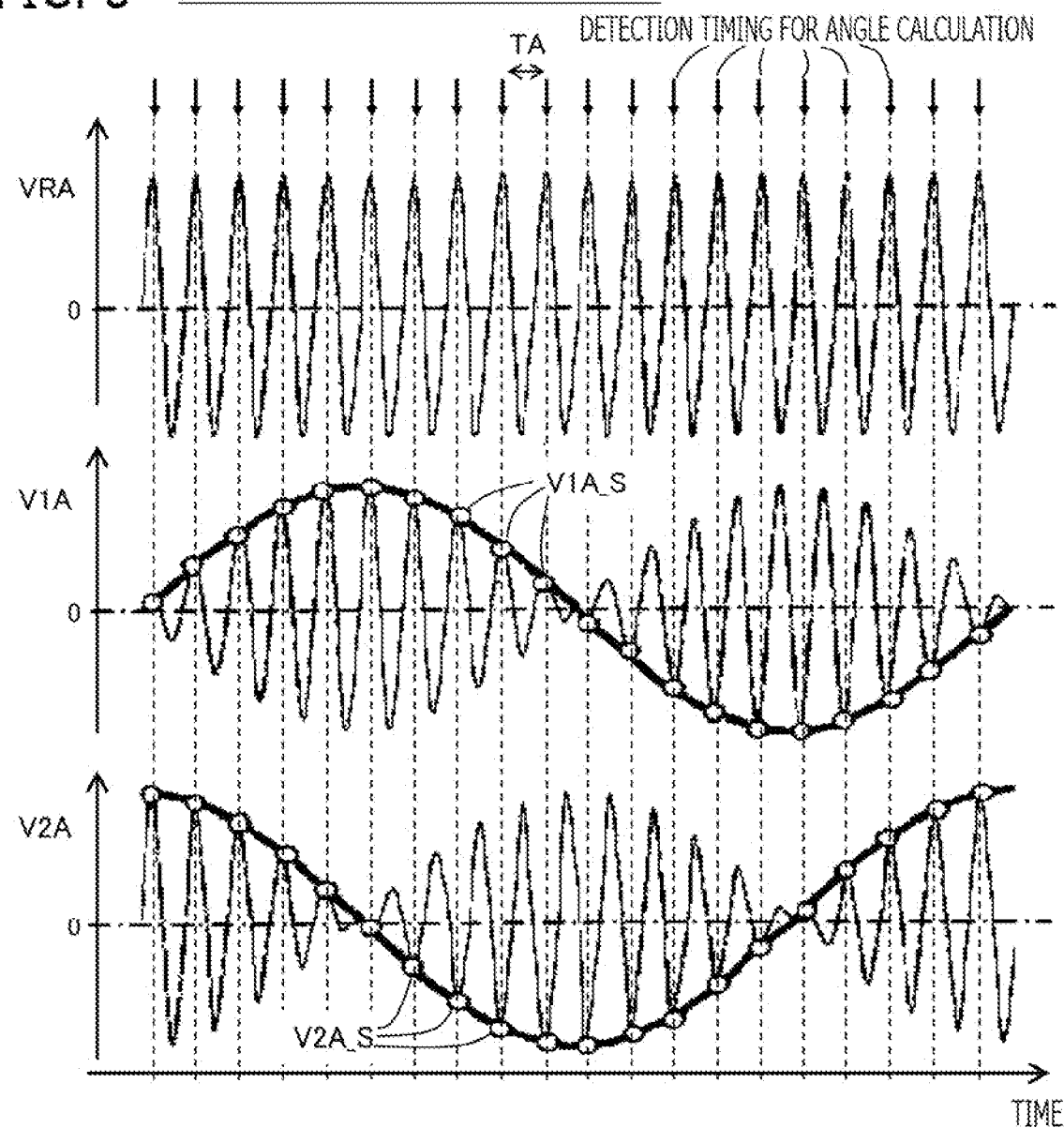
FIG. 3 is a time chart for explaining the first system detection timing when supposing that there is no magnetic interference between systems according to Embodiment 1.

As showing an example supposed that there is no magnetic interference between two systems in FIG. 3, when the rotor rotates in the state where the AC voltage VRA is applied to the first system excitation winding 10A, the amplitude of AC voltage V1A induced by the first system first output winding 111A and the amplitude of AC voltage V2A induced by the first system second output winding 112A change in a sine wave shape (or in a cosine wave shape), according to the rotational angle (the gap permeance) in the electrical angle of the rotor. The first system first output winding 111A and the first system second output winding 112A are wound around the positions of the circumferential direction of the stator 13 so that the amplitudes of those AC voltages are mutually different 90 degrees in the electrical angle. Similarly, the second system first output winding 111B and the second system second output winding 112B are wound around the positions of the circumferential direction of the stator 13 so that the amplitudes of those induced AC voltages are mutually different 90 degrees in the electrical angle.

In the present embodiment, as shown in FIG. 2, the stator 13 is provided with 12 teeth arranged equally in the circumferential direction; the first system windings are wound around the first teeth TE1 to the sixth teeth TE6; and the second system windings are wound around the seventh teeth TE7 to the twelfth teeth TE12. The first system excitation winding 10A is distributed and wound around the first teeth TE1 to the sixth teeth TE6. The first system first output winding 111A and the first system second output winding 112A are distributed and wound around the first teeth TE1 to the sixth teeth TE6 so that the amplitudes of those induced AC voltages are mutually different 90 degrees in the electrical angle. Similarly, the second system excitation winding 10B is distributed and wound around the seventh teeth TE7 to the twelfth teeth TE12. The second system first output winding 111B and the second system second output winding 112B are distributed and wound around the seventh teeth TE7 to the twelfth teeth TE12 so that the amplitudes of those induced AC voltages are mutually different 90 degrees in the electrical angle.

The first system excitation winding 10A wound around the plurality of teeth is connected in series between teeth; and the two terminals of the first system excitation winding 10A connected in series are connected to the controller 50 (the first system excitation unit 51A) described below. Similarly, the two terminals of the first system first output winding 111A connected in series between teeth are connected to the controller 50 (the first system output signal detection unit 52A) described below. The two terminals of the first system second output winding 112A connected in series between teeth are connected to the controller 50 (the first system output signal detection unit 52A) described below. The two terminals of the second system excitation winding 10B wound around the plurality of teeth are connected to the controller 50 (the second system excitation unit 51B) described below. Similarly, the two terminals of the second system first output winding 111B connected in series between teeth are connected to the controller 50 (the second system output signal detection unit 52B) described below. The two terminals of the second system second output winding 112B connected in series between teeth are connected to the controller 50 (the second system output signal detection unit 52B) described below.

The number of projection parts (shaft angle multiplier) and the number of teeth may be set to any numbers. The first system windings and the second system windings may not be arranged being divided into two in the circumferential direction, but may be arranged being distributed in the circumferential direction.

1-2. Controller 50

The abnormality detection apparatus for resolver is provided with a controller 50. As shown in FIG. 1, the controller 50 is provided with a first system excitation unit 51A, a first system output signal detection unit 52A, a first system reduction processing unit 53A, a first system angle calculation unit 54A, a first system square sum calculation unit 55A, a first system abnormality detection unit 56A, a second system excitation unit 51B, a second system output signal detection unit 52B, a second system reduction processing unit 53B, a second system angle calculation unit 54B, a second system square sum calculation unit 55B, and a second system abnormality detection unit 56B. Each function of the controller 50 is realized by processing circuits provided in the controller 50.

Figure 4:
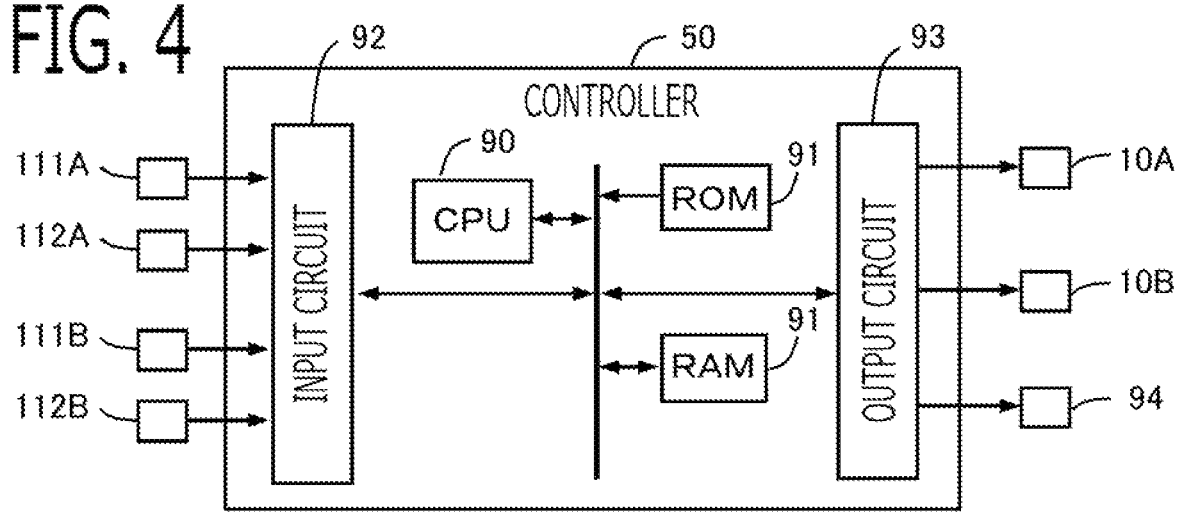
FIG. 4 is a hardware configuration diagram of the controller according to Embodiment 1.

Specifically, as shown in FIG. 4, the controller 50 includes, as a processing circuit, a arithmetic processor (computer) 90 such as a CPU (Central Processing Unit), storage apparatuses 91 which exchange data with the arithmetic processor 90, an input circuit 92 which inputs external signals to the arithmetic processor 90, an output circuit 93 which outputs signals from the arithmetic processor 90 to the outside, and the like.

As the arithmetic processor 90, ASIC (Application Specific Integrated Circuit), IC (Integrated Circuit), DSP (Digital Signal Processor), FPGA (Field Programmable Gate Array), various kinds of logical circuits, various kinds of signal processing circuits, and the like may be provided. As the arithmetic processor 90, a plurality of the same type ones or the different type ones may be provided, and each processing may be shared and executed. As the storage apparatuses 91, there are provided a RAM (Random Access Memory) which can read data and write data from the arithmetic processor 90, a ROM (Read Only Memory) which can read data from the arithmetic processor 90, and the like. The first system first output winding 111A, the first system second output winding 112A, the second system first output winding 111B, and the second system second output winding 112B are connected to the input circuit 92. The input circuit 92 is provided with an A/D converter and the like for inputting the output voltages of these windings into the arithmetic processor 90. The output circuit 93 is connected with the first system excitation winding 10A and the second system excitation winding 10B, and is provided with driving circuits, such as switching devices for applying the AC voltage VRA to these windings. A lowpass filter circuit may be provided in the output side of the switching device. The output circuit 93 is provided with signal output circuits, such as a communication circuit which transmits the first angle θ1, the second angle θ2, the first system abnormality signal ERR1, and the second system abnormality signal ERR2 which were calculated to the external controller 94.

Then, the arithmetic processor 90 runs software items (programs) stored in the storage apparatus 91 such as a ROM and collaborates with other hardware devices in the controller 50, such as the storage apparatus 91, the input circuit 92, and the output circuit 93, so that the respective functions of the control units 51A to 56B included in the controller 50 are realized. Setting data utilized in the control units 51A to 56B are stored, as part of software items (programs), in the storage apparatus 91 such as a ROM. Each function of the controller 50 will be described in detail below.

1-2-1. Excitation Unit

The first system excitation unit 51A applies AC voltage VRA (in this example, AC voltage VRA of a sine wave) of first period TA to the first system excitation winding 10A. The first system excitation unit 51A calculates an AC voltage command of the first period TA, and generates the PWM signal (Pulse Width Modulation) which turns on and off the switching device for the first system excitation winding provided in the output circuit 93, based on the comparison result between the AC voltage command and the triangular wave. When the switching device is turned on, the power source voltage is applied to the first system excitation winding 10A side, and when the switching device is turned off, the application of the power source voltage stops.

The second system excitation unit 51B applies AC voltage VRB (in this example, AC voltage VRB of a sine wave) of second period TB to the second system excitation winding 10B. The second period TB is set to a period different from the first period TA. In the present embodiment, as described later, the second period TB is set to two times of the first period TA (TB=2×TA). For example, in the case of TA=50 microseconds, it is set as TB=100 microseconds.

The second system excitation unit 51B calculates an AC voltage command of the second period TB, and generates the PWM signal (Pulse Width Modulation) which turns on and off the switching device for the second system excitation winding provided in the output circuit 93, based on the comparison result between the AC voltage command and the triangular wave.

1-2-2. First System Output Signal Detection Unit

The first system output signal detection unit 52A detects periodically the output signals V1A, V2A of the first system two output windings 111A, 112A at preliminarily set detection timing (hereinafter, referred to also as the first system detection timing).

1-2-3. First System Reduction Processing Unit

<Problem Due to Magnetic Interference Between Systems>

Figure 5:
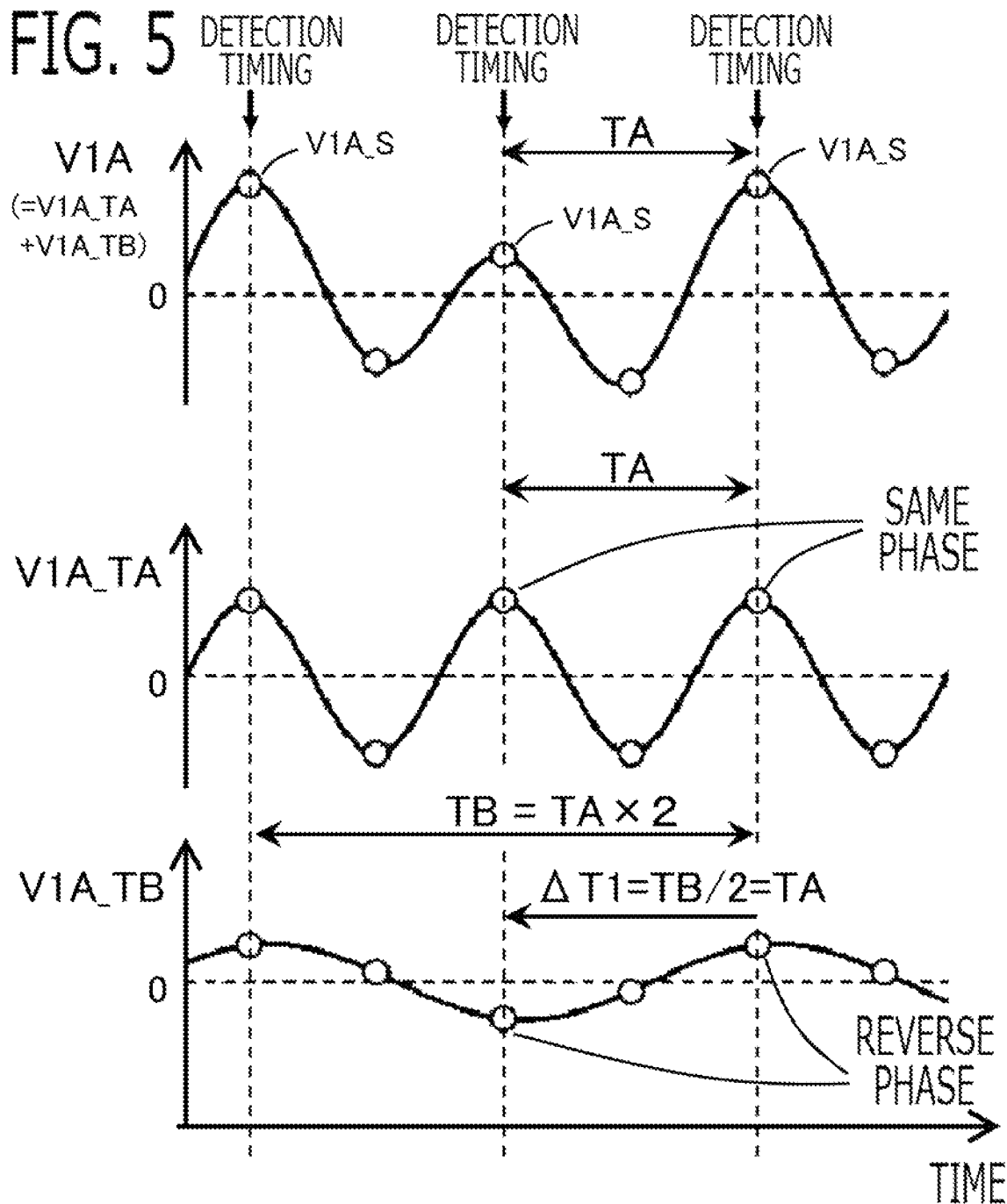
FIG. 5 is a time chart for explaining the second period component reduction processing of the first system according to Embodiment 1.

As showing an example of the output signal V1A of the first system first output winding in FIG. 5, the components of the second period V1A_TB, V2A_TB induced by electromagnetic induction due to the magnetic flux of the second period TB excited in the second system excitation winding 10B are superimposed on each of the output signals V1A, V2A of the first system two output windings 111A, 112A, due to the magnetic interference between systems. The output signal V1A of the first system first output winding is shown in the upper row graph of FIG. 5; the component of the first period V1A_TA induced by electromagnetic induction due to the magnetic flux of the first system excitation winding 10A included in the output signal V1A of the first system first output winding is shown in the middle graph; and the component of the second period V1A_TB induced by electromagnetic induction due to the magnetic flux of the second system excitation winding 10B included in the output signal V1A of the first system first output winding is shown in the lower row graph. The output signal V1A of first system first output winding becomes a signal obtained by totaling the component of the first period V1A_TA and the component of the second period V1A_TB.

<Second Period Component Reduction Processing>

Then, the first system reduction processing unit 53A performs a second period component reduction processing which reduces component of the second period, to the detection values of output signals of first system two output windings V1A_S, V2A_S. Then, the first system square sum calculation unit 55A described below calculates a first system square sum V1_amp which is a sum of square values of the detection values of output signals of first system two output windings V1A_F, V2A_F after the second period component reduction processing.

In the present embodiment, the first period component reduction processing is performed based on a principle explained in the following. As shown in the lower row graph of FIG. 5, in the component of the second period V1A_TB of the output signal of the first system first output winding, the phase is reversed and the sign of plus or minus is reversed at a period (for example, half period TB/2 of the second period) obtained by adding an integral multiple of the second period TB to a half period TB/2 of the second period.

Then, as the second period component reduction processing, the first system reduction processing unit 53A adds the detection values of output signals of first system two output windings V1A_S, V2A_S detected at this time detection timing, and the detection values of output signals of first system two output windings V1A_Sold, V2A_Sold detected at a detection timing earlier by the first system reduction processing interval ΔT1 than this time detection timing. The first system reduction processing interval ΔT1 is set as shown in the next equation. Herein, M is an integer greater than or equal to 0. In the present embodiment, M is set to 0, and the first system reduction processing interval ΔT1 is set to the half period TB/2 of the second period.

$$\Delta T1 = TB/2 + TB \times M \quad (1)$$

Figure 6:
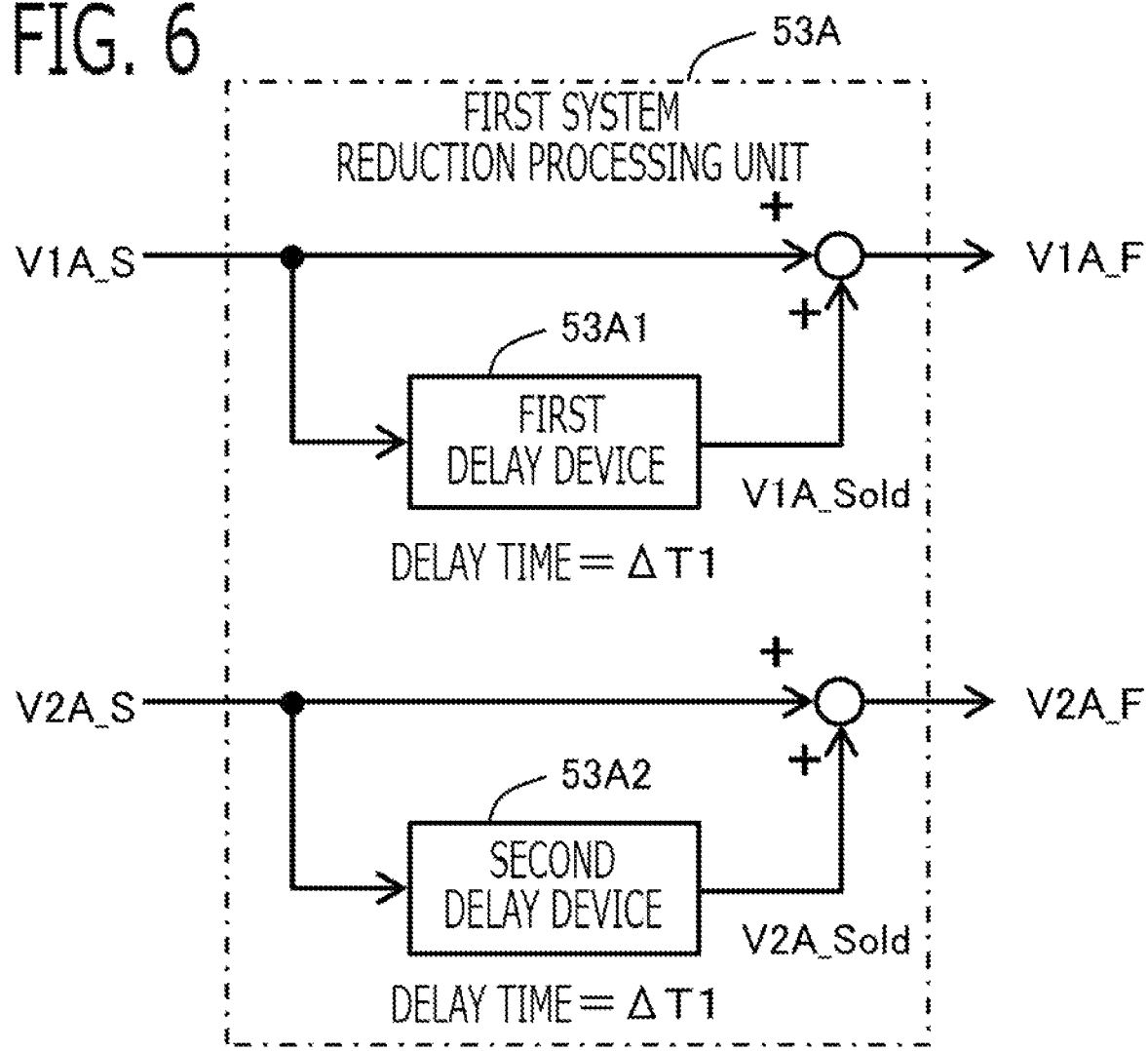
FIG. 6 is a block diagram of the first system reduction processing unit according to Embodiment 1.

The first system reduction processing unit 53A is constituted, for example, as shown in FIG. 6. The first system reduction processing unit 53A is provided with a first delay device 53A1 which delays the detection value V1A_S of the output signal of the first system first output winding by the first system reduction processing interval ΔT1, and outputs; adds the detection value V1A_S of the output signal of the first system first output winding, and the output V1A_Sold of the first delay device 53A1; and calculates the detection value V1A_F of the output signal of the first system first output winding after the second period component reduction processing. Similarly, the first system reduction processing unit 53A is provided with a second delay device 53A2 which delays the detection value V2A_S of the output signal of the first system second output winding by the first system reduction processing interval ΔT1, and outputs; adds the detection value V2A_S of the output signal of the first system second output winding, and the output V2A_Sold of the second delay device 53A2; and calculates the detection value V2A_F of the output signal of the first system second output winding after the second period component reduction processing.

Then, the first system square sum calculation unit 55A calculates the first system square sum V1_amp which is a sum of square values of the detection values of output signals of first system two output windings V1A_F, V2A_F after the second period component reduction processing.

According to this configuration, the two components of the second period whose signs of plus or minus are reversed with each other are added, and the two components of the second period are canceled with each other. Accordingly, in the detection values of output signals of first system two output windings V1A_F, V2A_F after addition, the component of the second period is reduced. Then, using the components of the first period of the first system in which the component of the second period of the second system was reduced, the first system square sum V1_amp used for first system abnormality determination can be calculated with good accuracy.

In the present embodiment, the second period TB is set to an even multiple of the first period TA, as shown in the next equation. Herein, N is an integer greater than or equal to 1. In the present embodiment, N is set to 1, and the second period TB is set to a twice of the first period TA. For example, if the first period TA is set to 50 microseconds, the second period TB is set to 100 microseconds.

$$TB = TA \times 2 \times N \quad (2)$$

According to this configuration, as shown in the next equation in which the equation (2) is substituted in the equation (1), the first system reduction processing interval $\Delta T1$ becomes an integral multiple of the first period TA.

$$\Delta T1 = TA \times (N + 2 \times N \times M) \quad (3)$$

Therefore, among the detection values of output signals of first system two output windings V1A_S, V2A_S, values before and after the integral multiple of the first period TA are added. Then, as shown in FIG. 5, since the added two components of the first period have the same phase, and become the equivalent values with the same sign of plus or minus, the detection values of output signals of first system two output windings V1A_F, V2A_F after addition correspond to the double values of the components of the first period V1A_TA, V2A_TA included in the detection values, respectively.

$$V1A\_F \approx 2 \times V1A\_TA$$

$$V2A\_F \approx 2 \times V2A\_TA \quad (4)$$

Accordingly, in the equation (5) and the equation (6) described below, since a square value of the detection value V1A_F of the output signal of the first system first output winding after addition and a square value of the detection value V2A_F of the output signal of the first system second output winding after addition are added, it corresponds to a 4 times value of the square sum of the components of the first period V1A_TA, V2A_TA, and the first system square sum V1_amp can be calculated with good accuracy, based on the components of the first period of the first system in which the components of the second period of the second system were reduced.

In the present embodiment, M is set to 0, and N is set to 1. Therefore, the first system reduction processing unit 53A adds the detection values of output signals of first system two output windings V1A_S, V2A_S detected at this time detection timing, and the detection values of output signals of first system two output windings V1A_Sold, V2A_Sold detected before the first period TA (the half period TB/2 of the second period).

In the present embodiment, the first system output signal detection unit 52A detects the output signals V1A, V2A of the first system two output windings at a timing when the AC voltage VRA of the first period TA applied to the first system excitation winding 10A becomes the maximum value or the minimum value (in this example, the maximum value). The first system output signal detection unit 52A detects the output signals V1A, V2A of the first system two output windings at every the first period TA when the AC voltage VRA becomes the maximum value. That is to say, the first system detection timing is set to the timing at every the first period TA.

FIG. 3 shows an example in which unlike the present embodiment, there is no magnetic interference between systems, and the component of the second period is not superimposed on the output signals V1A, V2A of the first system two output windings. At every the first period TA when the AC voltage VRA of the first period TA becomes the maximum value, the output signals V1A, V2A of the first system two output windings are detected. Therefore, the component of the first period included in the detection values of the output signals of the first system two output windings becomes the maximum value or the minimum value of the component of the first period which is vibrating at the first period TA. Therefore, the amplitude of the component of the first period included in the detection values of the output signals of the first system two output windings can be maximized, the detection sensitivity of the component of the first period to the noise component can be increased, and the detection accuracy can be increased. The first system output signal detection unit 52A may detect the output signals V1A, V2A of the first system two output windings at the timing when the AC voltage VRA of the first period TA becomes other than the maximum value or the minimum value, excepting the timing when the AC voltage VRA of the first period TA becomes the vibration center value (node).

1-2-4. First System Square Sum Calculation Unit

The first system square sum calculation unit 55A calculates the first system square sum V1_amp which is a sum of square values of the detection values of output signals of first system two output windings V1A_F, V2A_F after the second period component reduction processing, as shown in the next equation.

$$V1\_amp = V1A\_F^2 + V2A\_F^2 \quad (5)$$

As shown in the equation (4), the detection values of output signals of the first system two output windings V1A_F, V2A_F after the second period component reduction processing correspond to the double values of the components of the first period V1A_TA, V2A_TA included in the detection values, respectively. Therefore, as shown in the next equation in which the equation (4) is substituted in the equation (5), it corresponds to a 4 times value of the square sum of the components of the first period V1A_TA, V2A_TA. Therefore, using the components of the first period V1A_TA, V2A_TA of the first system in which the component of the second period V1A_TB, V2A_TB of the second system was reduced, the first system square sum V1_amp used for first system abnormality determination can be calculated with good accuracy.

$$V1\_amp \approx (2 \times V1A\_TA)^2 + (2 \times V2A\_TA)^2 \quad (6)$$

$$= 4 \times \{V1A\_TA^2 + V2A\_TA^2\}$$

1-2-5. First System Abnormality Detection Unit

The first system abnormality detection unit 56A determines abnormality of first system, based on whether or not the first system square sum V1_amp is within a preliminarily set normal range of first system.

As explained using FIG. 3 and the like, as shown in the next equation, if the first system is normal, the component of the first period V1A_TA outputted from the first system first output winding 111A becomes a sine wave signal according to the angle θ1 in the electrical angle of the rotor, and the component of the first period V2A_TA outputted from the first system second output winding 112A becomes a cosine wave signal according to the angle θ1 in the electrical angle of the rotor. Herein, KA1 is a prescribed constant related to induced voltage.

$$V1A\_TA = KA1 \times \sin(\theta 1)$$

$$V2A\_TA = KA1 \times \cos(\theta 1) \tag{7}$$

Accordingly, as shown in the next equation in which the equation (7) is substituted in the equation (6), if the first system is normal, the first system square sum V1_amp becomes a prescribed value (normal value). Accordingly, when the first system square sum V1_amp deviates from the normal range including the normal value, it can be determined that abnormality occurred in the first system.

$$\begin{aligned} V1\_amp &\approx 4 \times \{(KA1 \times \sin(\theta 1))^2 + (KA1 \times \cos(\theta 1))^2\} \\ &= 4 \times KA1^2 \times \{\sin(\theta 1)^2 + \cos(\theta 1)^2\} \\ &= 4 \times KA1^2 \times 1 \end{aligned} \tag{8}$$

On the other hand, in the case where the second period component reduction processing (addition processing) is not performed unlike the present embodiment, and the components of the second period are superimposed on the detection values of output signals of first system two output windings, as shown in FIG. 5, since the phases of components of the second period are reversed at every first system detection timing, a vibration component of the second period TB is superimposed on the first system square sum V1_amp, and the first system abnormality determination cannot be performed with good accuracy.

The abnormality of first system includes abnormality of disconnection of each winding 10A, 111A, 112A of the first system, abnormality of the input and output circuit of each winding of the first system in the controller 50, abnormality of processing related to the first system of the controller 50, and the like.

The normal range of first system is set to a range between a lower limit value of first system MIN1 and an upper limit value of first system MAX1 in which a normal value of the first system square sum V1_amp is included. For example, the lower limit value of first system MIN1 is preliminarily set to a value obtained by multiplying a coefficient (for example, 0.9) smaller than 1 to the normal value of the first system square sum V1_amp; and the upper limit value of first system MAX1 is preliminarily set to a value obtained by multiplying a coefficient (for example, 1.1) larger than 1 to the normal value of the first system square sum V1_amp. The normal range of first system is adjusted in accordance with the degree of abnormality to be determined as abnormal.

Figure 7:
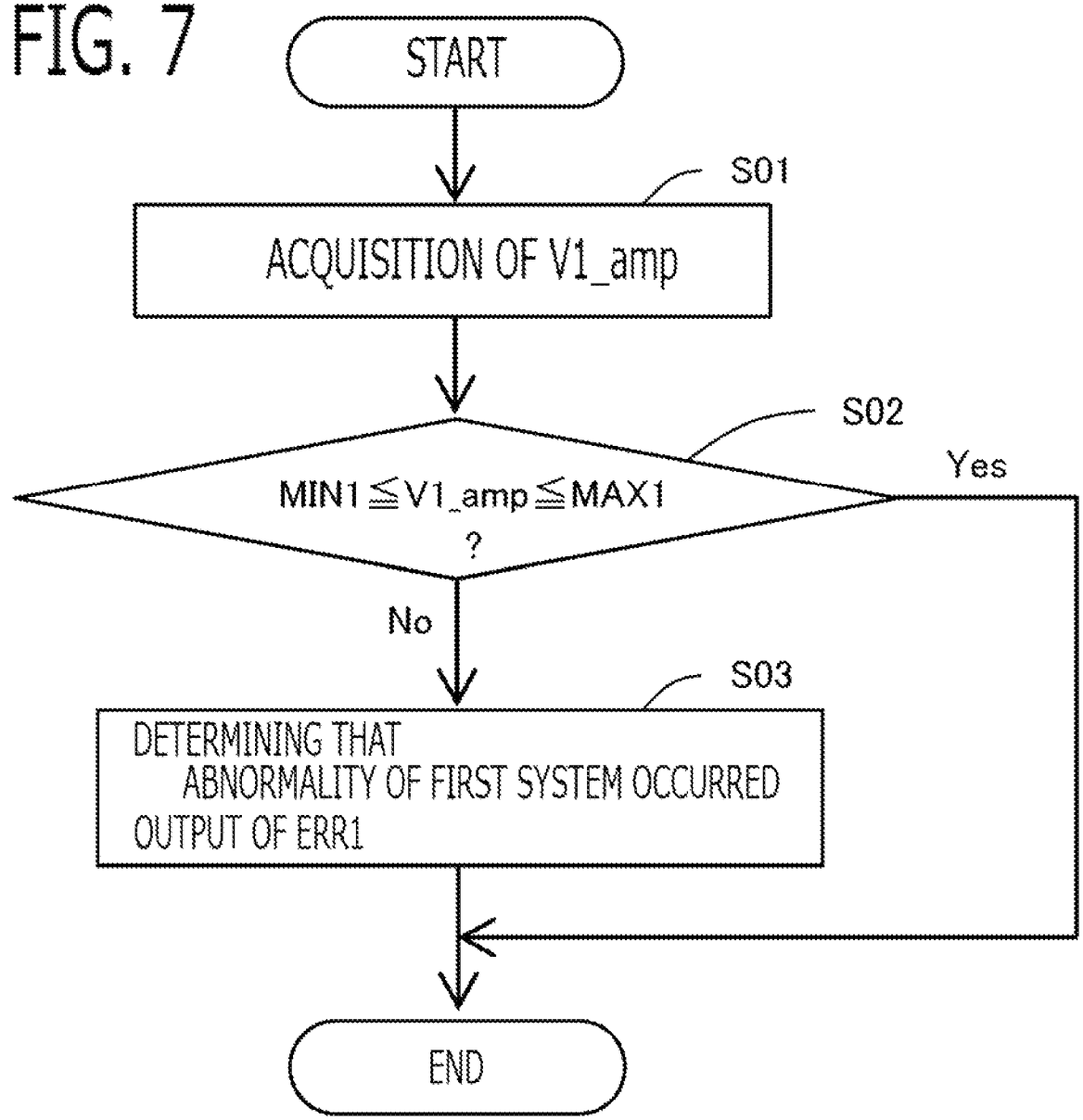
FIG. 7 is a flowchart explaining the abnormality detection processing of the first system according to Embodiment 1.

Processing of the abnormality determination is explained using the flowchart of FIG. 7. Processing of the flowchart of FIG. 7 is executed after calculating the first system square sum V1_amp at every the first system detection timing.

In the step S01, the first system abnormality detection unit 56A acquires the first system square sum V1_amp calculated by the first system square sum calculation unit 55A. Then, in the step S02, the first system abnormality detection unit 56A determines whether or not the first system square sum V1_amp is greater than or equal to the lower limit value of first system MIN1, and is less than or equal to the upper limit value of first system MAX1. That is to say, the first system abnormality detection unit 56A determines whether or not the first system square sum V1_amp is within the normal range of first system.

When the first system abnormality detection unit 56A determines that the first system square sum V1_amp is not within the normal range of first system in the step S02, it advances to the step S03 and determines that the abnormality of first system occurred. In the present embodiment, the first system abnormality detection unit 56A outputs a first system abnormality signal ERR1, when determining that the abnormality of first system occurred. For example, the first system abnormality signal ERR1 is transmitted to the external controller 94 to which the first angle θ1 is transmitted. If the controller 50 and the external controller 94 are integrated, the first system abnormality signal ERR1 is transmitted in the same controller.

On the other hand, when the first system abnormality detection unit 56A determines that the first system square sum V1_amp is within the normal range of first system in the step S02, it determines that the abnormality of first system does not occur, and ends processing.

<Another Example of Abnormality Determination Processing>

Figure 8:
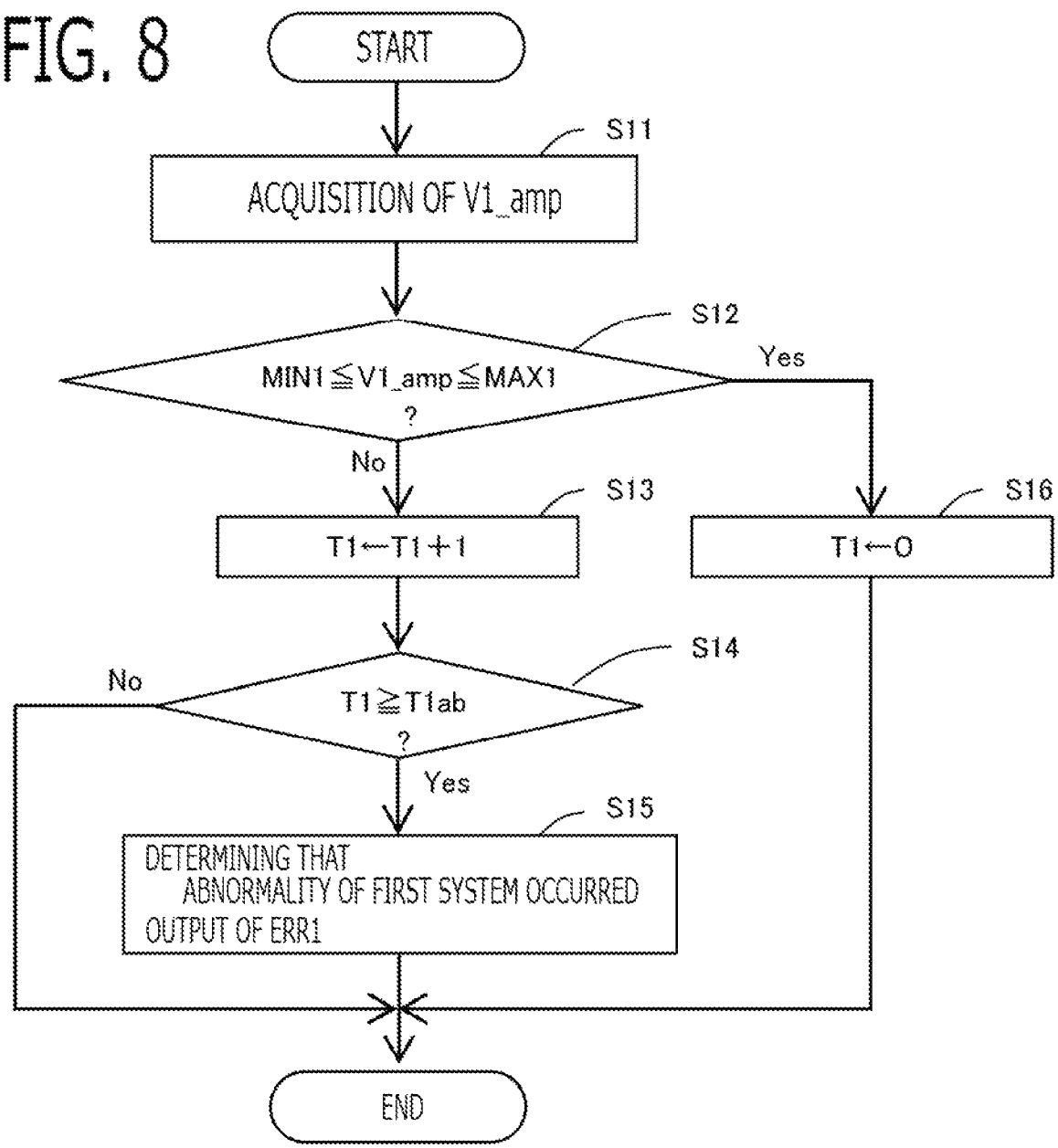
FIG. 8 is a flowchart explaining another example of the abnormality detection processing of the first system according to Embodiment 1.

Another example of processing of abnormality determination is explained using the flowchart of FIG. 8. Processing of the flowchart of FIG. 8 is executed after calculating the first system square sum V1_amp at every the first system detection timing.

In the step S11, the first system abnormality detection unit 56A acquires the first system square sum V1_amp calculated by the first system square sum calculation unit 55A. Then, in the step S12, the first system abnormality detection unit 56A determines whether or not the first system square sum V1_amp is greater than or equal to the lower limit value of first system MIN1, and is less than or equal to the upper limit value of first system MAX1. That is to say, the first system abnormality detection unit 56A determines whether or not the first system square sum V1_amp is within the normal range of first system.

When the first system abnormality detection unit 56A determines that the first system square sum V1_amp is not within the normal range of first system in the step S12, it advances to the step S13 and increases the abnormality determination counter T1 by one. After that, it advances to the step S14, and the first system abnormality detection unit 56A determines whether or not the abnormality determination counter T1 is greater than or equal to a preliminarily set abnormality determination frequency T1ab.

When the first system abnormality detection unit 56A determines that the abnormality determination counter T1 is greater than or equal to the abnormality determination frequency T1ab in the step S14, it advances to the step S15 and determines that the abnormality of first system occurred. Then, the first system abnormality detection unit 56A outputs the first system abnormality signal ERR1, when determining that the abnormality of first system occurred. When the first system abnormality detection unit 56A determines that the abnormality determination counter T1 is not greater than or equal to the abnormality determination frequency T1ab in the step S14, it determines that the abnormality of first system does not occur, and ends processing.

On the other hand, when the first system abnormality detection unit 56A determines that the first system square sum V1_amp is within the normal range of first system in the step S12, it advances to the step S16, after resetting the abnormality determination counter T1 to 0, ends processing.

In the example of the flowchart of FIG. 8, when a case where the first system square sum V1_amp is not within the normal range of first system occurs continuously the preliminarily set abnormality determination frequency T1ab or more, the first system abnormality detection unit 56A determines that abnormality occurred in the first system.

In this way, by performing determination by the abnormality determination frequency T1ab, erroneous determination can be prevented from occurring due to noise component generated in the first system square sum V1_amp. By determining that abnormality occurred when it is not within the normal range continuously, accuracy of abnormality determination can be improved.

In the step S16, the first system abnormality detection unit 56A may not reset the abnormality determination counter T1 to 0, but may hold the abnormality determination counter T1 to the previous value, or may decrease the abnormality determination counter T1.

1-2-6. First System Angle Calculation Unit

As shown in the next equation, the first system angle calculation unit 54A calculates the first angle θ1 by calculating an arc tangent (an arc tangent function) of a ratio between the output signal V1A_F of the first system first output winding and the output signal V2A_F of the first system second output winding after the second period component reduction processing.

$$\theta 1 = \tan^{-1}(V1A\_F/V2A\_F) \quad (9)$$

As shown in the equation (4), the detection values of output signals of the first system two output windings V1A_F, V2A_F after the second period component reduction processing correspond to the double values of the components of the first period V1A_TA, V2A_TA included in the detection values, respectively. Therefore, as shown in the next equation in which the equation (4) is substituted in the equation (9), the first angle θ1 is calculated with good accuracy by the ratio of the components of the first period V1A_TA, V2A_TA included in the detection values.

$$\theta 1 \approx \tan^{-1}\{(2 \times V1A\_TA)/(2 \times V2A\_TA)\} = \tan^{-1}(V1A\_TA/V2A\_TA) \quad (10)$$

1-2-6. Second System Output Signal Detection Unit

The second system output signal detection unit 52B detects periodically the output signals V1B, V2B of the second system two output windings 111B, 112B at preliminarily set detection timing (hereinafter, referred to also as the second system detection timing).

1-2-8. Second System Reduction Processing Unit

<Problem Due to Magnetic Interference Between Systems>

Figure 9:
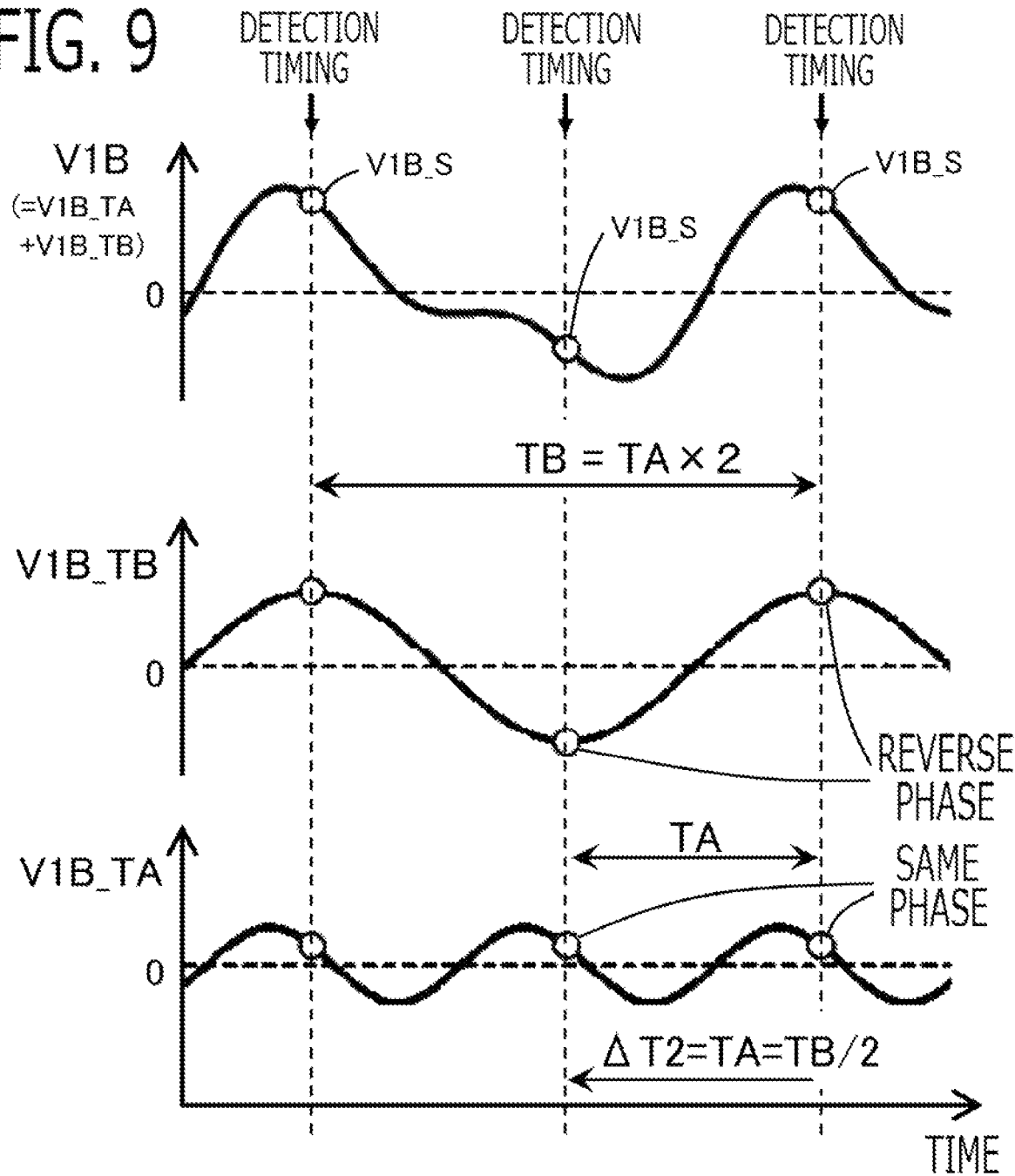
FIG. 9 is a time chart for explaining the first period component reduction processing of the second system according to Embodiment 1.

As showing an example of the output signal V1B of the second system first output winding in FIG. 9, the components of the first period induced by the magnetic flux of the first period TA excited in the first system excitation winding 10A are superimposed on each of the output signals V1B, V2B of the second system two output windings 111B, 112B, due to the magnetic interference between systems. The output signal V1B of the second system first output winding is shown in the upper row graph of FIG. 9; the component of the second period V1B_TB induced by electromagnetic induction of the magnetic flux of the second system excitation winding 10B included in the output signal V1B of the second system first output winding is shown in the middle graph; and the component of the first period V1B_TA induced by electromagnetic induction of the magnetic flux of the first system excitation winding 10A included in the output signal V1B of the second system first output winding is shown in the lower row graph. The output signal V1B of second system first output winding becomes a signal obtained by totaling the component of the second period V1B_TB and the component of the first period V1B_TA.

<First Period Component Reduction Processing>

Then, the second system reduction processing unit 53B performs a first period component reduction processing which reduces component of the first period, to the detection values of output signals of second system two output windings V1B_S, V2B_S. Then, the second system square sum calculation unit 55B described below calculates a second system square sum V2_amp which is a sum of square values of the detection values of output signals of second system two output windings V1B_F, V2B_F after the first period component reduction processing.

In the present embodiment, the first period component reduction processing is performed based on a principle explained in the following. As shown in the lower row graph of FIG. 9, the component of the first period V1B_TA of the output signal of second system first output winding becomes the same value at every first period TA, since its period is the first period TA.

Then, as the first period component reduction processing, the second system reduction processing unit 53B performs a subtraction processing that calculates differences between the detection values of output signals of second system two output windings V1B_S, V2B_S detected at this time detection timing, and the detection values of output signals of second system two output windings V1B_Sold, V2B_Sold detected at the detection timing earlier by the second system reduction processing interval ΔT2 than this time detection timing. The second system reduction processing interval ΔT2 is set to an integral multiple of the first period TA, as shown in the next equation. Herein, P is an integer greater than or equal to 1. In the present embodiment, P is set to 1, and the second system reduction processing interval ΔT2 is set to the first period TA.

$$\Delta T2 = TA \times P \quad (11)$$

Figure 10:
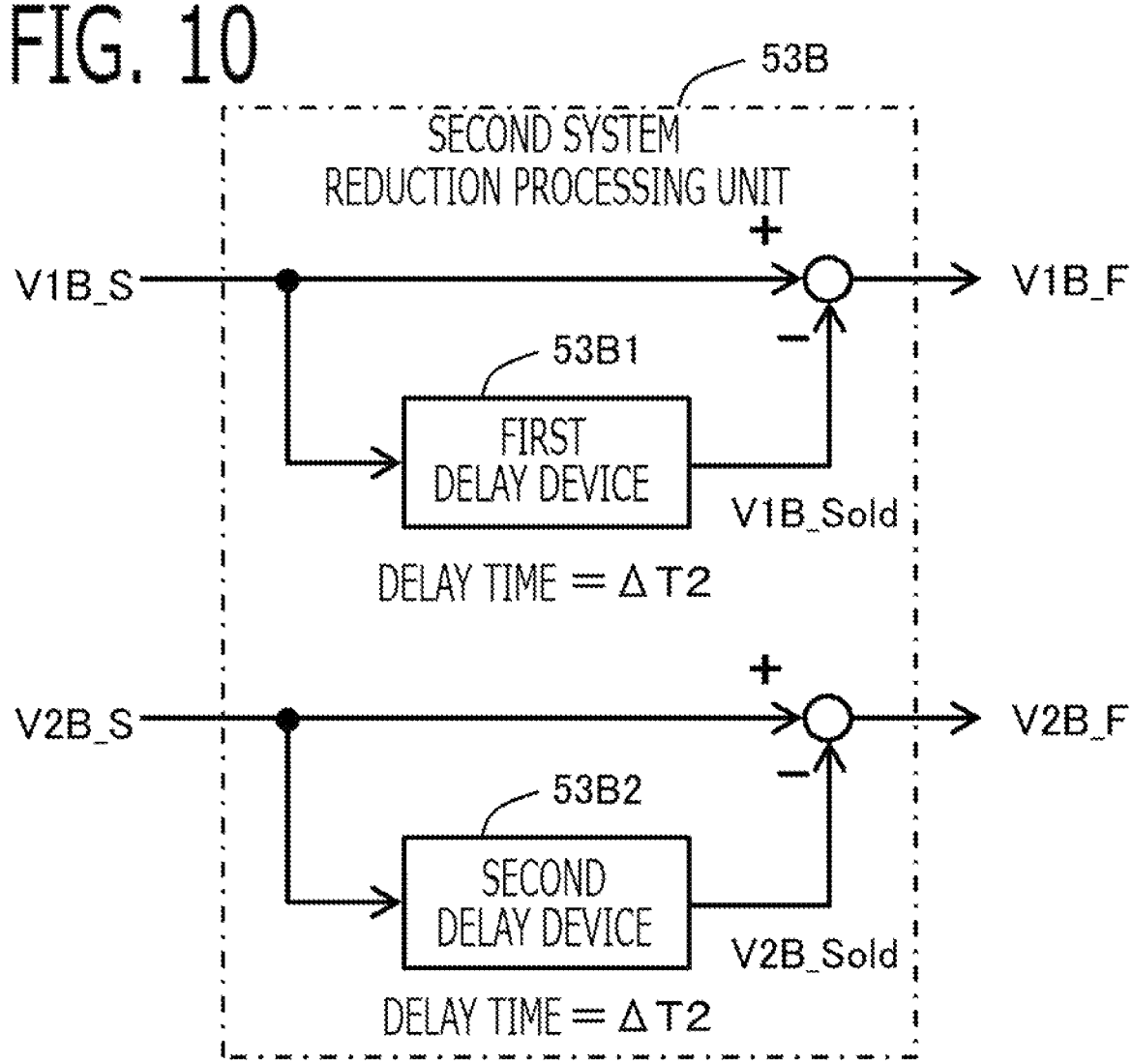
FIG. 10 is a block diagram of the second system reduction processing unit according to Embodiment 1.

The second system reduction processing unit 53B is constituted, for example, as shown in FIG. 10. The second system reduction processing unit 53B is provided with a first delay device 53B1 which delays the detection value V1B_S of the output signal of the second system first output winding by the second system reduction processing interval ΔT2, and outputs; subtracts the output V1B_Sold of the first delay device 53B1 from the detection value V1B_S of the output signal of the second system first output winding; and calculates the detection value V1B_F of the output signal of the second system first output winding after the first period component reduction processing. Similarly, the second system reduction processing unit 53B is provided with a second delay device 53B2 which delays the detection value V2B_S of the output signal of the second system second output winding by the second system reduction processing ΔT2, and outputs; subtracts the output V2B_Sold of the second delay device 53B2 from the detection value V2B_S of the output signal of the second system second output winding; and calculates the detection value V2B_F of the output signal of the second output winding after the first period component reduction processing.

Then, the second system square sum calculation unit 55B calculates the second system square sum V2_amp which is a sum of square values of the detection values of output signals of second system two output windings V1B_F, V2B_F after the first period component reduction processing.

According to this configuration, the two components of the first period which become the equivalent values with the same sign of plus or minus with each other are subtracted, and the two components of the first period are canceled with each other. Accordingly, in the detection values of output signals of second system two output windings V1B_F, V2B_F after the subtraction processing, the component of the first period is reduced. Then, using the components of the second period of the second system in which the component of the first period of the first system was reduced, the second system square sum V2_amp used for second system abnormality determination can be calculated with good accuracy.

As mentioned above, in the present embodiment, the second period TB is set to an even multiple of the first period TA, as shown in the next equation. Herein, N is an integer greater than or equal to 1. In the present embodiment, N is set to 1, and the second period TB is set to a twice of the first period TA.

$$TB = TA \times 2 \times N \tag{12}$$

The second reduction processing ΔT2 is set as shown in the next equation. Herein, L is an integer greater than or equal to 0. In the present embodiment, L is set to 0, and the second system reduction processing interval ΔT2 is set to the half period TB/2 of the second period.

$$\Delta T2 = TB/2 + TB \times L \tag{13}$$

Even in this case, if the equation (12) is substituted in the equation (13), the second system reduction processing interval ΔT2 becomes an integral multiple of the first period TA similarly to the equation (11), as shown in the next equation. Therefore, as mentioned above, by the first period component reduction processing (the subtraction processing), the components of the first period can be reduced.

$$\Delta T2 = TA \times N \times (1 + 2 \times L) \tag{14}$$

By setting the second system reduction processing interval ΔT2 like the equation (13), in the two components of the second period subtracted by the subtraction processing, the phases are reversed and the signs of plus or minus are reversed, as shown in FIG. 9. Therefore, the detection values of output signals of second system two output windings V1B_F, V2B_F after the subtraction processing correspond to the double values of the components of the second period V1B_TB, V2B_TB included in the detection values, respectively.

$$V1B\_F \approx 2 \times V1B\_TB$$

$$V2B\_F \approx 2 \times V2B\_TB \tag{15}$$

Accordingly, in the equation (16) and the equation (17) described below, since a square value of the detection value V1B_F of the output signal of the second system first output winding after subtraction processing and a square value of the detection value V2B_F of the output signal of the second system second output winding after subtraction processing are added, it corresponds to a 4 times value of the square sum of the components of the second period V1B_TB, V2B_TB, and the second system square sum V2_amp can be calculated with good accuracy, based on the components of the second period of the second system in which the components of the first period of the first system were reduced.

In the present embodiment, L is set to 0, N is set to 1, and P is set to 1. Therefore, the second system reduction processing unit 53B subtracts the detection values of output signals of second system two output windings V1B_Sold, V2B_Sold detected before the half period TB/2 of the second period (the first period TA), from the detection values of output signals of second system two output windings V1B_S, V2B_S detected at this time detection timing.

In the present embodiment, the second system output signal detection unit 52B detects the output signals V1B, V2B of the second system two output windings at a timing when the AC voltage VRB of the second period TB applied to the second system excitation winding 10B becomes the maximum value or the minimum value. The second system output signal detection unit 52B detects the output signals V1B, V2B of the second system two output windings at every the half period TB/2 of the second period when the AC voltage VRB becomes the maximum value or the minimum value.

According to this configuration, similar to the first system, the component of the second period included in the detection values of the output signals of the second system two output windings becomes the maximum value or the minimum value of the component of the second period which is vibrating at the second period TB. Therefore, the amplitude of the component of the second period included in the detection values of the output signals of the second system two output windings can be maximized, the detection sensitivity of the component of the second period to the noise component can be increased, and the detection accuracy can be increased. The second system output signal detection unit 52B may detect the output signals V1B, V2B of the second system two output windings at the timing when the AC voltage VRB of the second period TB becomes other than the maximum value or the minimum value, excepting the timing when the AC voltage VRB of the second period TB becomes the vibration center value (node).

1-2-9. Second System Square Sum Calculation Unit

The second system square sum calculation unit 55B calculates the second system square sum V2_amp which is a sum of square values of the detection values of output signals of second system two output windings V1B_F, V2B_F after the first period component reduction processing, as shown in the next equation.

$$V2\_amp = V1B\_F^2 + V2B\_F^2 \tag{16}$$

As shown in the equation (15), the detection values of output signals of the second system two output windings V1B_F, V2B_F after the first period component reduction processing correspond to the double values of the components of the second period V1B_TB, V2B_TB included in the detection values, respectively. Therefore, as shown in the next equation in which the equation (15) is substituted in the equation (16), it corresponds to a 4 times value of the square sum of the components of the second period V1B_TB, V2B_TB. Therefore, using the components of the second period V1B_TB, V2B_TB of the second system in which the component of the first period V1B_TA, V2B_TA of the first system was reduced, the second system square sum V2_amp used for second system abnormality determination can be calculated with good accuracy.

$$V2\_amp \approx (2 \times V1B\_TB)^2 + (2 \times V2B\_TB)^2 \tag{17}$$

-continued $$= 4 \times \{V1B\_TB^2 + V2B\_TB^2\}$$

1-2-10. Second System Abnormality Detection Unit

The second system abnormality detection unit 56B determines abnormality of second system, based on whether or not the second system square sum V2_amp is within a preliminarily set normal range of second.

Similarly to the first system, as shown in the next equation, if the second system is normal, the component of the second period V1B_TB outputted from the second system first output winding 111B becomes a sine wave signal according to the angle θ2 in the electrical angle of the rotor, and the component of the second period V2B_TB outputted from the second system second output winding 112B becomes a cosine wave signal according to the angle θ2 in the electrical angle of the rotor. Herein, KA2 is a prescribed constant related to induced voltage.

$$V1B\_TB = KA2 \times \sin(\theta 2)$$

$$V2B\_TB = KA2 \times \cos(\theta 2) \tag{18}$$

Accordingly, as shown in the next equation in which the equation (18) is substituted in the equation (17), if the second system is normal, the second system square sum V2_amp becomes a prescribed value (normal value). Accordingly, when the second system square sum V2_amp deviates from the normal range including the normal value, it can be determined that abnormality occurred in the second system.

$$V2\_amp \approx 4 \times \{(KA2 \times \sin(\theta 2))^2 + (KA2 \times \cos(\theta 2))^2\} = \tag{19}$$

$$4 \times KA2^2 \times \{\sin(\theta 2)^2 + \cos(\theta 2)^2\} = 4 \times KA2^2 \times 1$$

On the other hand, in the case where the first period component reduction processing (subtraction processing) is not performed unlike the present embodiment, and the components of the first period are superimposed on the detection values of output signals of second system two output windings, as shown in FIG. 9, since the components of the first period are the same between the second system detection timings, a vibration component of the first period TA is superimposed on the second system square sum V2_amp, and the second system abnormality determination cannot be performed with good accuracy.

The abnormality of second system includes abnormality of disconnection of each winding 10B, 111B, 112B of the second system, abnormality of the input and output circuit of each winding of the second system in the controller 50, abnormality of processing related to the second system of the controller 50, and the like.

The normal range of second system is set to a range between a lower limit value of second system MIN2 and an upper limit value of second system MAX2 in which a normal value of the second system square sum V2_amp is included. For example, the lower limit value of second system MIN2 is preliminarily set to a value obtained by multiplying a coefficient (for example, 0.9) smaller than 1 to the normal value of the second system square sum V2_amp; and the upper limit value of second system MAX2 is preliminarily set to a value obtained by multiplying a coefficient (for example, 1.1) larger than 1 to the normal value of the second system square sum V2_amp. The normal range of second system is adjusted in accordance with the degree of abnormality to be determined as abnormal.

Figure 11:
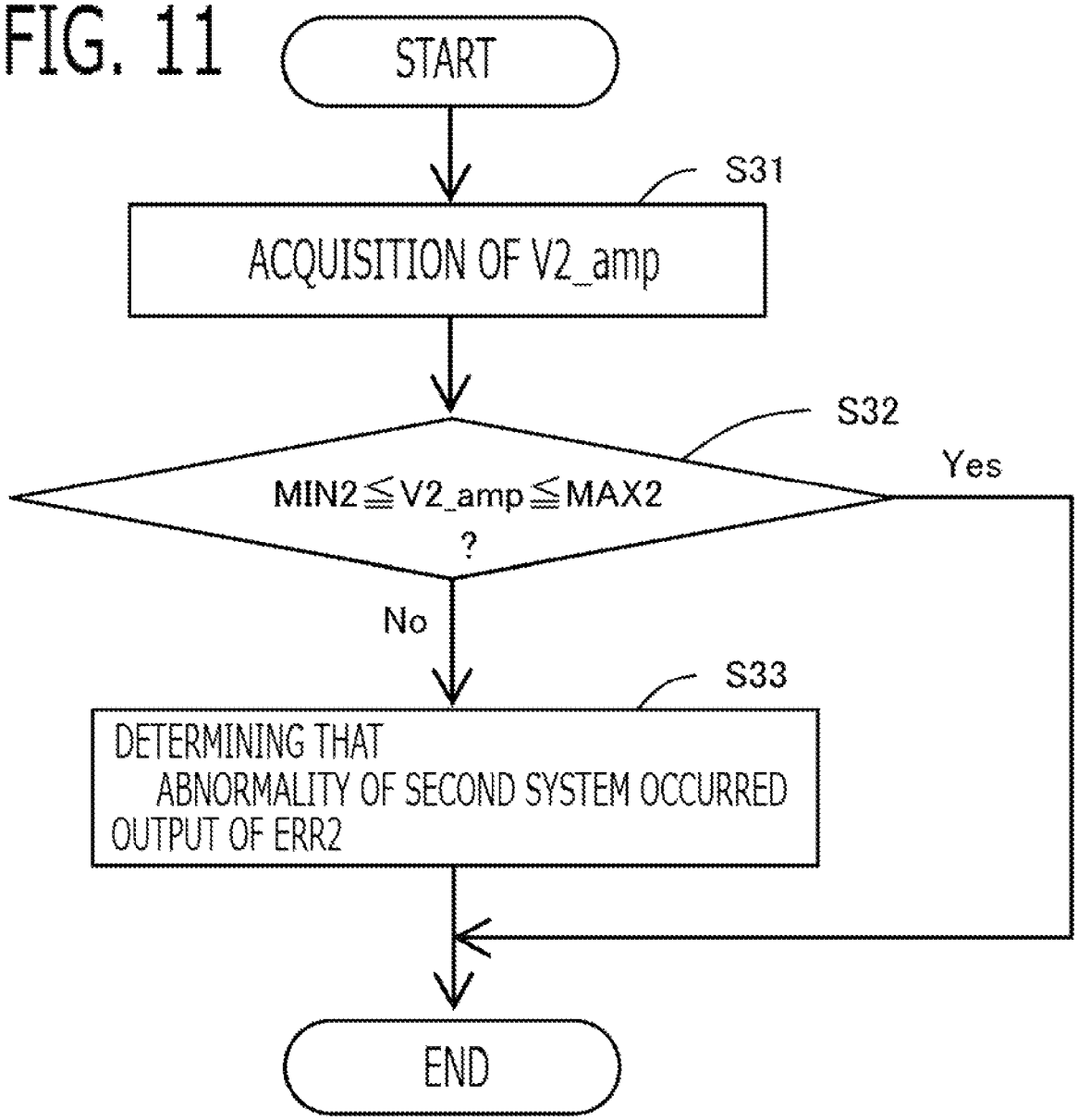
FIG. 11 is a flowchart explaining the abnormality detection processing of the second system according to Embodiment 1.

Processing of the abnormality determination is explained using the flowchart of FIG. 11. Processing of the flowchart of FIG. 11 is executed after calculating the second system square sum V2_amp at every the second system detection timing.

In the step S31, the second system abnormality detection unit 56B acquires the second system square sum V2_amp calculated by the second system square sum calculation unit 55B. Then, in the step S32, the second system abnormality detection unit 56B determines whether or not the second system square sum V2_amp is greater than or equal to the lower limit value of second system MIN2, and is less than or equal to the upper limit value of second system MAX2. That is to say, the second system abnormality detection unit 56B determines whether or not the second system square sum V2_amp is within the normal range of second system.

When the second system abnormality detection unit 56B determines that the second system square sum V2_amp is not within the normal range of second system in the step S32, it advances to the step S33 and determines that the abnormality of second system occurred. In the present embodiment, the second system abnormality detection unit 56B outputs a second system abnormality signal ERR2, when determining that the abnormality of second system occurred. For example, the second system abnormality signal ERR2 is transmitted to the external controller 94 to which the second angle θ2 is transmitted. If the controller 50 and the external controller 94 are integrated, the second system abnormality signal ERR2 is transmitted in the same controller.

On the other hand, when the second system abnormality detection unit 56B determines that the second system square sum V2_amp is within the normal range of second system in the step S32, it determines that the abnormality of second system does not occur, and ends processing.

<Another Example of Abnormality Determination Processing>

Figure 12:
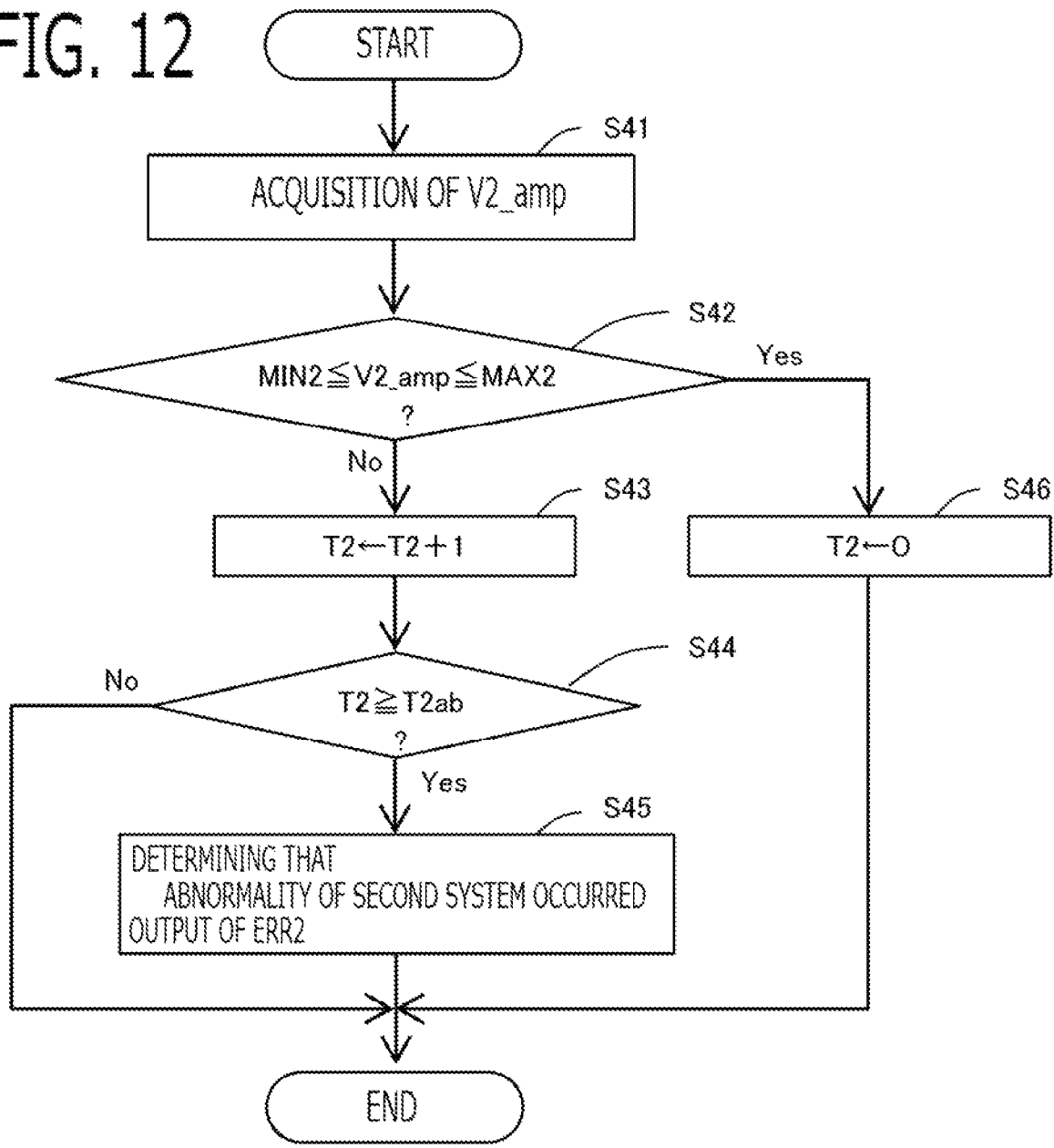
FIG. 12 is a flowchart explaining another example of the abnormality detection processing of the second system according to Embodiment 1.

Another example of processing of abnormality determination is explained using the flowchart of FIG. 12. Processing of the flowchart of FIG. 12 is executed after calculating the second system square sum V2_amp at every the second system detection timing.

In the step S41, the second system abnormality detection unit 56B acquires the second system square sum V2_amp calculated by the second system square sum calculation unit 55B. Then, in the step S42, the second system abnormality detection unit 56B determines whether or not the second system square sum V2_amp is greater than or equal to the lower limit value of second system MIN2, and is less than or equal to the upper limit value of second system MAX2. That is to say, the second system abnormality detection unit 56B determines whether or not the second system square sum V2_amp is within the normal range of second system.

When the second system abnormality detection unit 56B determines that the second system square sum V2_amp is not within the normal range of second system in the step S42, it advances to the step S43 and increases the abnormality determination counter T2 by one. After that, it advances to the step S44, and the second system abnormality detection unit 56B determines whether or not the abnormality determination counter T2 is greater than or equal to a preliminarily set abnormality determination frequency T2ab.

When the second system abnormality detection unit 56B determines that the abnormality determination counter T2 is greater than or equal to the abnormality determination frequency T2ab in the step S44, it advances to the step S45 and determines that the abnormality of second system occurred. Then, the second system abnormality detection unit 56B outputs the second system abnormality signal ERR2, when determining that the abnormality of second system occurred. When the second system abnormality detection unit 56B determines that the abnormality determination counter T2 is not greater than or equal to the abnormality determination frequency T2ab in the step S44, it determines that the abnormality of second system does not occur, and ends processing.

On the other hand, when the second system abnormality detection unit 56B determines that the second system square sum V2_amp is within the normal range of second system in the step S42, it advances to the step S46, after resetting the abnormality determination counter T2 to 0, ends processing.

In the example of the flowchart of FIG. 12, when a case where the second system square sum V2_amp is not within the normal range of second system occurs continuously the preliminarily set abnormality determination frequency T2ab or more, the second system abnormality detection unit 56B determines that abnormality occurred in the second system.

In this way, by performing determination by the abnormality determination frequency T2ab, erroneous determination can be prevented from occurring due to noise component generated in the second system square sum V2_amp. By determining that abnormality occurred when it is not within the normal range continuously, accuracy of abnormality determination can be improved.

In the step S46, the second system abnormality detection unit 56B may not reset the abnormality determination counter T2 to 0, but may hold the abnormality determination counter T2 to the previous value, or may decrease the abnormality determination counter T2.

1-2-11. Second System Angle Calculation Unit

As shown in the next equation, the second system angle calculation unit 54B calculates the second angle θ2 by calculating an arc tangent (an arc tangent function) of a ratio between the output signal V1B_F of the second system first output winding and the output signal V2B_F of the second system second output winding after the first period component reduction processing.

$$\theta 2 = \tan^{-1}(V1B\_F/V2B\_F) \qquad (20)$$

As shown in the equation (15), the detection values of output signals of the second system two output windings V1B_F, V2B_F after the first period component reduction processing correspond to the double values of the components of the second period V1B_TB, V2B_TB included in the detection values, respectively. Therefore, as shown in the next equation in which the equation (15) is substituted in the equation (20), the second angle θ2 is calculated with good accuracy by the ratio of the components of the second period V1B_TB, V2B_TB included in the detection values.

$$\theta 2 \approx \tan^{-1}\{(2 \times V1B\_TB)/(2 \times V2B\_TB)\} = \tan^{-1}(V1B\_TB/V2B\_TB) \qquad (21)$$

It is only required that the setting values of the first period TA, the second period TB, the first system detection timing, the second system detection timing, the first system reduction processing interval ΔT1, and the second system reduction processing interval ΔT2 are preliminarily set to become the predetermined relation between the first system and the second system; the processing of the first system and the processing of the second system can be performed independently with each other; and it is not necessary to perform synchronous control in real time between the first system and the second system.

2. Embodiment 2

Next, the abnormality detection apparatus for resolver according to Embodiment 2 will be explained. The explanation for constituent parts the same as those in Embodiment 1 will be omitted. The basic configuration of the abnormality detection apparatus for resolver according to the present embodiment is the same as that of Embodiment 1. Embodiment 2 is different from Embodiment 1 in configuration of the second system output signal detection unit 52B, and the second system reduction processing unit 53B.

Also in the present embodiment, the second system output signal detection unit 52B detects periodically the output signals V1B, V2B of the second system two output windings 111B, 112B at preliminarily set detection timing (the second system detection timing).

<Problem Due to Magnetic Interference Between Systems>

Figure 13:
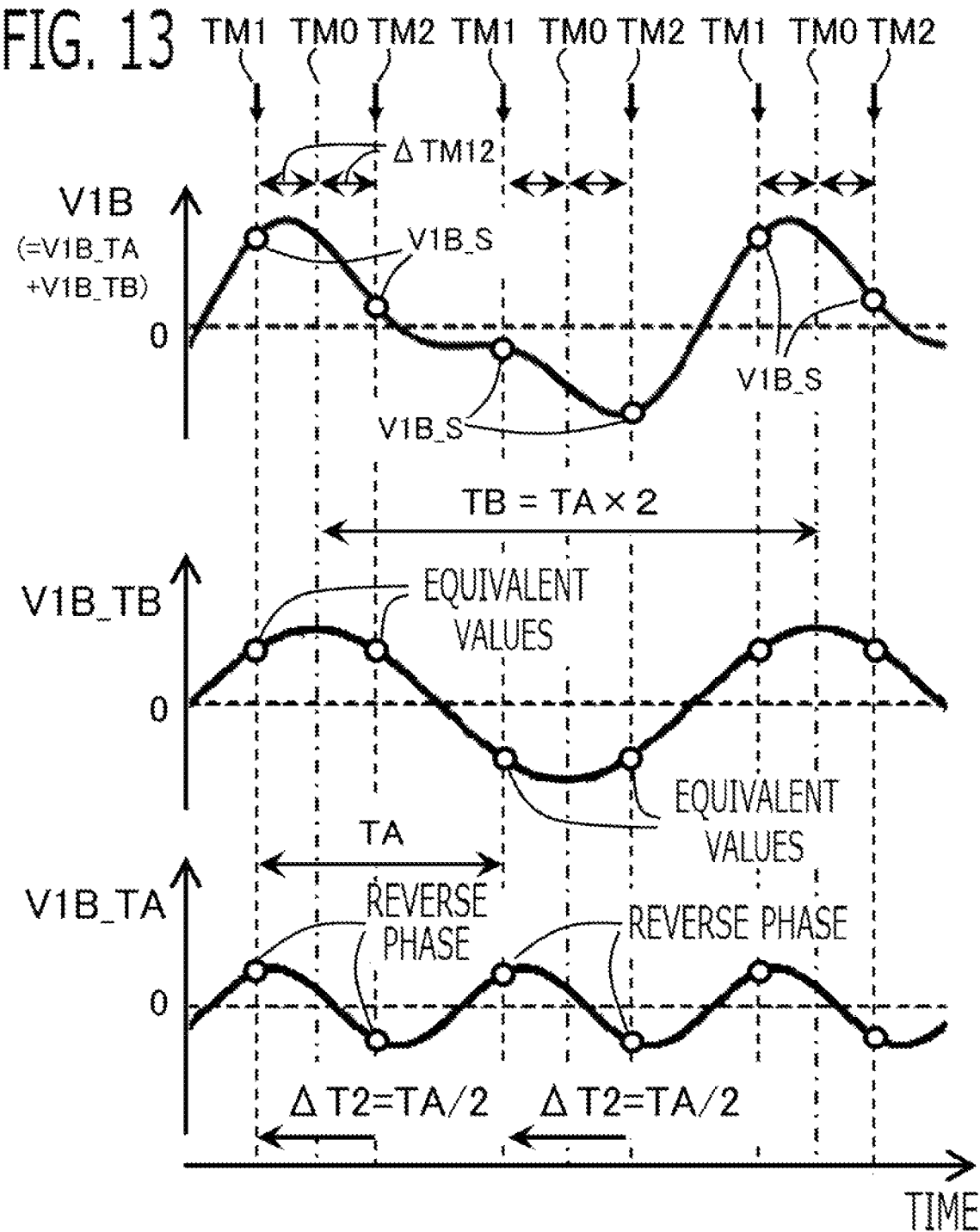
FIG. 13 is a time chart for explaining the first period component reduction processing of the second system according to Embodiment 2.

As showing an example of the output signal V1B of the second system first output winding in FIG. 13, the components of the first period induced by electromagnetic induction of the magnetic flux of the first period TA excited in the first system excitation winding 10A are superimposed on each of the output signals V1B, V2B of the second system two output windings 111B, 112B, due to the magnetic interference between systems. The output signal V1B of the second system first output winding is shown in the upper row graph of FIG. 13; the component of the second period V1B_TB induced by electromagnetic induction of the magnetic flux of the second system excitation winding 10B included in the output signal V1B of the second system first output winding is shown in the middle graph; and the component of the first period V1B_TA induced by electromagnetic induction of the magnetic flux of the first system excitation winding 10A included in the output signal V1B of the second system first output winding is shown in the lower row graph. The output signal V1B of the second system first output winding becomes a signal obtained by totaling the component of the second period V1B_TB and the component of the first period V1B_TA, and if the second system square sum V2_amp is calculated with these signals, error will occur. Therefore, in order to suppress the error of the second system square sum V2_amp, it is necessary to reduce the component of the first period V1B_TA from the output signal V1B of the second system first output winding.

<First Period Component Reduction Processing>

Also in the present embodiment, the second system reduction processing unit 53B performs a first period component reduction processing which reduces component of the first period, to the detection values of output signals of second system two output windings V1B_S, V2B_S.

In the present embodiment, unlike Embodiment 1, the first period component reduction processing is performed based on a principle explained in the following. As shown in the lower row graph of FIG. 13, in the component of the first period V1B_TA of the output signal of the second system first output winding, the phase is reversed and the sign of plus or minus is reversed in a period (for example, half period TA/2 of the second period) obtained by adding an integral multiple of the first period TA to a half period TA/2 of the first period.

Then, as the first period component reduction processing, the second system reduction processing unit 53B adds the detection values of output signals of second system two output windings V1B_S, V2B_S detected at this time detection timing, and the detection values of output signals of second system two output windings V1B_Sold, V2B_Sold detected at the detection timing earlier by the second system reduction processing interval ΔT2 than this time detection timing. The second system reduction processing interval ΔT2 is set to an interval obtained by adding an integral multiple of the first period TA to the half period TA/2 of the first period, as shown in the next equation. Herein, X is an integer greater than or equal to 0. In the present embodiment, X is set to 0, and the second system reduction processing interval ΔT2 is set to the half period TA/2 of the first period.

$$\Delta T2 = TA/2 + TA \times X \quad (22)$$

Then, similar to Embodiment 1, then, the second system square sum calculation unit 55B calculates the second system square sum V2_amp which is a sum of square values of the detection values of output signals of second system two output windings V1B_F, V2B_F after addition. Then, the second system abnormality detection unit 56B determines abnormality of second system, based on whether or not the second system square sum V2_amp is within a preliminarily set normal range of second.

According to this configuration, the two components of the first period whose signs of plus or minus are reversed with each other are added, and the two components of the first period are canceled with each other. Accordingly, in the detection values V1B_F, V2B_F of the output signals of the second system two output windings after addition, the components of the first period are reduced. Then, using the components of the second period of the second system in which the component of the first period of the first system was reduced, the second system square sum V2_amp used for second system abnormality determination can be calculated with good accuracy.

In the present embodiment, as shown in FIG. 13, the second system output signal detection unit 52B detects periodically the output signals of second system two output windings V1B, V2B at two timings TM1, TM2 which become before-and-after symmetrical with respect to a reference timing TM0 when the AC voltage VRB of the second period TB applied to the second system excitation winding 10B becomes the maximum value or the minimum value.

An interval between two timings which become before-and-after symmetry is set to the second system reduction processing interval ΔT2. Therefore, as shown in the next equation, an interval ΔTM12 between each of before-and-after two timings TM1, TM2 and the reference timing TM0 is set to the half of the second system reduction processing interval ΔT2.

$$\Delta TM12 = \Delta T2/2 \quad (23)$$

Then, the second system reduction processing unit 53B adds the detection values of output signals of second system two output windings detected at the two timings TM1, TM2 which become before-and-after symmetry, with each other; and calculates the second angle θ2 and the second system square sum V2_amp, based on the detection values of output signals of second system two output windings V1B_F, V2B_F after addition According to this configuration, as shown in FIG. 13, the components of the second period included in the detection values of output signals of second system two output windings detected at two timings have the same phase, and become the equivalent values with the same sign of plus or minus. Since the interval between two timings TM1, TM2 is set to the second system reduction processing interval ΔT2, in the components of the first period included in the detection values of output signals of second system two output windings detected at two timings TM1, TM2, the phases are reversed and the signs of plus or minus are reversed. Therefore, the detection values V1B_F, V2B_F of the output signals of the second system two output windings after addition correspond to the double values of the components of the second period V1B_TB, V2B_TB included in the detection values, respectively.

$$V1B\_F \approx 2 \times V1B\_TB$$

$$V2B\_F \approx 2 \times V2B\_TB \quad (24)$$

Accordingly, in the equation (26) and the equation (27) described below, since a square value of the detection value V1B_F of the output signal of the second system first output winding after addition processing and a square value of the detection value V2B_F of the output signal of the second system second output winding after addition processing are added, it corresponds to a 4 times value of the square sum of the components of the second period V1B_TB, V2B_TB, and the second system square sum V2_amp can be calculated with good accuracy, based on the components of the second period of the second system in which the components of the first period of the first system were reduced.

Figure 14:
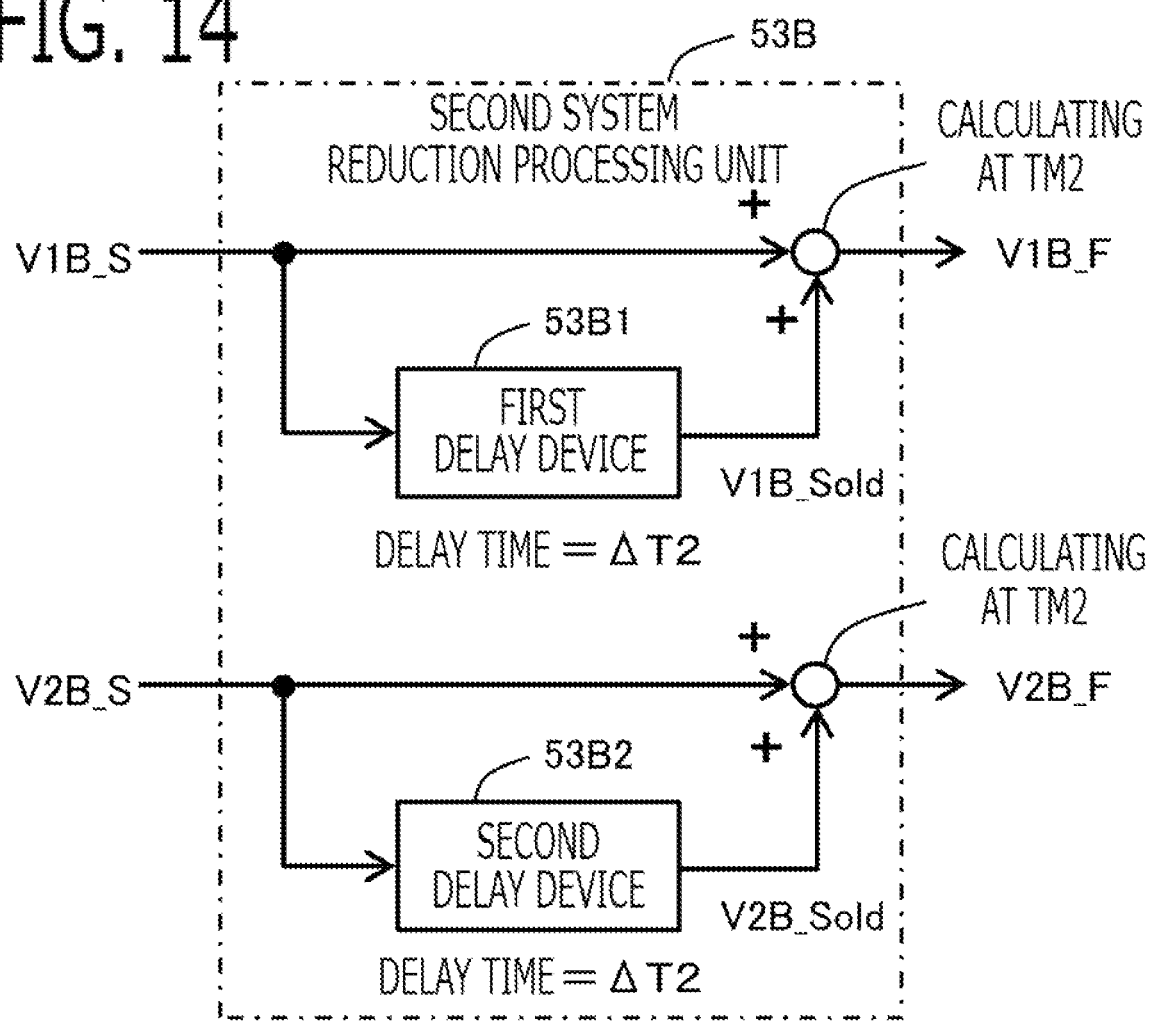
FIG. 14 is a block diagram of the second system reduction processing unit according to Embodiment 2.

The second system reduction processing unit 53B is constituted, for example, as shown in FIG. 14. The second system reduction processing unit 53B is provided with a first delay device 53B1 which delays the detection value V1B_S of the output signal of the second system first output winding by the second system reduction processing interval ΔT2, and outputs; adds the detection value V1B_S of the output signal of the second system first output winding and the output V1B_Sold of the first delay device 53B1, at the timing TM2 after the reference timing TM0; and calculates the detection value V1B_F of the output signal of the second system first output winding after the first period component reduction processing. Similarly, the second system reduction processing unit 53B is provided with a second delay device 53B2 which delays the detection value V2B_S of the output signal of the second system second output winding by the second system reduction processing interval ΔT2, and outputs; adds the detection value V2B_S of the output signal of the second system second output winding and the output V2B_Sold of the second delay device 53B2, at the timing TM2 after the reference timing TM0; and calculates the detection value V2B_F of the output signal of the second system second output winding after the first period component reduction processing.

In the present embodiment, as shown in the next equation, the second period TB is set to twice of the first period TA. The second system reduction processing interval ΔT2 is set to the half period TA/2 of the first period. Therefore, the interval ΔTM12 between each of before-and-after two timings TM1, TM2 and the reference timing TM0 is set to 1/4 period TA/4 of the first period.

$$TB = TA \times 2$$

$$\Delta T2 = TA/2$$

$$\Delta TM12 = TA/4 \quad (25)$$

The second system output signal detection unit 52B detects the output signals of second system two output windings V1B, V2B at every 1/4 period TB/4 of the second period; and each detection timing is set so as to become before-and-after symmetrical with respect to the reference timing TM0 when the AC voltage VRB of the second period TB becomes the maximum value or the minimum value.

<Calculation of Second System Square Sum>

Similarly to Embodiment 1, the second system square sum calculation unit 55B calculates the second system square sum V2_amp which is a sum of square values of the detection values of output signals of second system two output windings V1B_F, V2B_F after the first period component reduction processing, as shown in the next equation.

$$V2\_amp = V1B\_F^2 + V2B\_F^2 \quad (26)$$

As shown in the equation (24), the detection values of output signals of the second system two output windings V1B_F, V2B_F after the first period component reduction processing correspond to the double values of the components of the second period V1B_TB, V2B_TB included in the detection values, respectively. Therefore, as shown in the next equation in which the equation (24) is substituted in the equation (26), it corresponds to a 4 times value of the square sum of the components of the second period V1B_TB, V2B_TB. Therefore, using the components of the second period V1B_TB, V2B_TB of the second system in which the component of the first period V1B_TA, V2B_TA of the first system was reduced, the second system square sum V2_amp used for second system abnormality determination can be calculated with good accuracy.

$$V2\_amp \approx (2 \times V1B\_TB)^2 + (2 \times V2B\_TB)^2 = \quad (27)$$
$$4 \times \{V1B\_TB^2 + V2B\_TB^2\}$$

3. Embodiment 3

Figure 15:
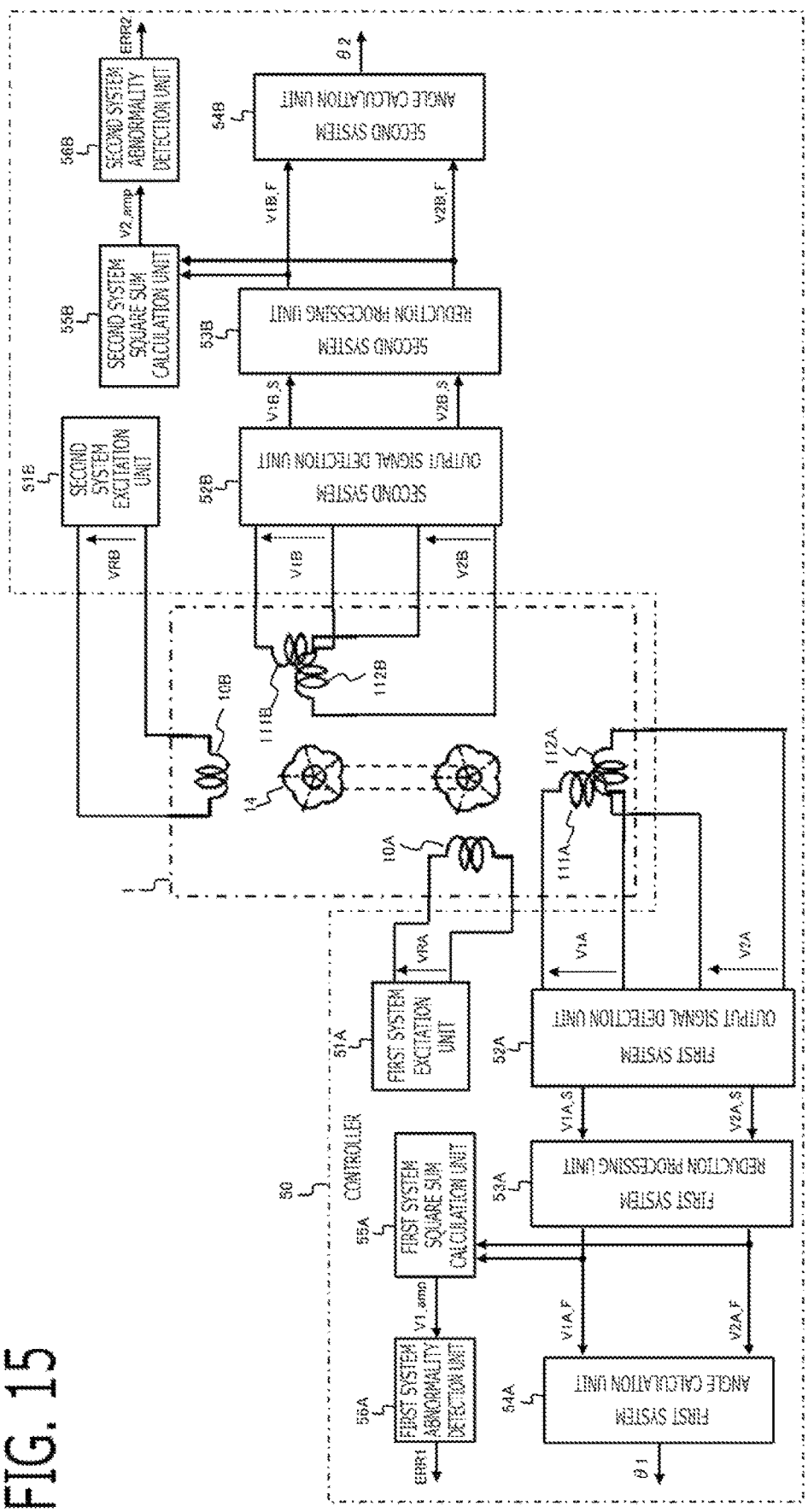
FIG. 15 is a schematic configuration diagram of the abnormality detection apparatus for resolver according to Embodiment 3.

Next, the abnormality detection apparatus for resolver according to Embodiment 3 will be explained. The explanation for constituent parts the same as those in each of Embodiments 1 or 2 will be omitted. The basic configuration of the abnormality detection apparatus for resolver according to the present embodiment is the same as that of Embodiment 1. But, the configuration of the resolver 1 is different from Embodiment 1 or 2. FIG. 15 is a schematic configuration diagram of the angle detection apparatus according to the present embodiment.

Similarly to Embodiment 1, the resolver 1 is provided with the first system excitation winding 10A, the first system two output windings 111A, 112A, the second system excitation winding 10B, and the second system two output windings 111B, 112B. A magnetic interference occurs between the first system windings and the second system windings.

Figure 16:
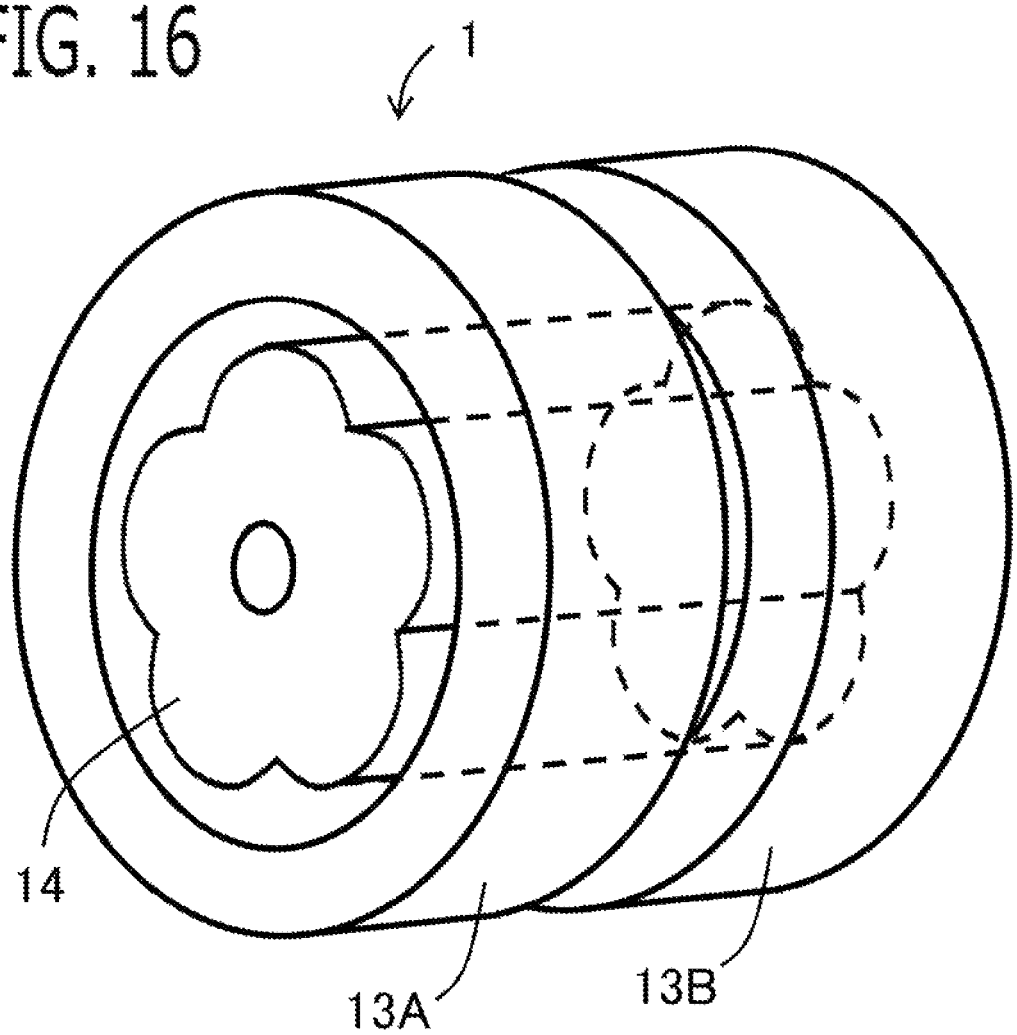
FIG. 16 is a schematic perspective view of the resolver according to Embodiment 3.

However, in the present embodiment, unlike Embodiment 1 and 2, as the schematic diagram of the resolver 1 is shown in FIG. 16, the first system excitation winding 10A and the first system two output windings 111A, 112A are wound around the first system stator 13A; and the second system excitation winding 10B and the second system two output windings 111B, 112B are wound around the second system stator 13B. The first system stator 13A and the second system stator 13B are arranged adjacent to each other in the axial direction; and a magnetic interference occurs between the first system windings and the second system windings. In FIG. 16, the teeth and the windings of the first system stator 13A, and the teeth and the windings of the second system stator 13B are omitted in figure.

The first system stator 13A and the second system stator 13B are coaxially arranged adjacent to each other in the axial direction; and the rotor 14 formed integrally is arranged in the radial-direction inner side of the first system stator 13A and the second system stator 13B. The rotor 14 is provided with a plurality of projection parts which are arranged equally in the circumferential direction on the peripheral part of the rotor. In the present embodiment, the rotor part located in the radial-direction inner side of the first system stator 13A and the rotor part located in the radial-direction inner side of the second system stator 13B have the same shape of the projection parts. The rotor part of the radial-direction inner side of the first system stator 13A and the rotor part of the radial-direction inner side of the second system stator 13B may have the different shapes and the different numbers of the projection parts with each other; and these may be the different bodies connected so as to rotate integrally.

The first system stator 13A is provided with a plurality of teeth arranged equally in the circumferential direction. The first system first output winding 111A and the first system second output winding 112A are distributed and wound around each teeth of the first system stator 13A so that the amplitudes of those induced AC voltages are mutually different 90 degrees in the electrical angle. The second system stator 13B is provided with a plurality of teeth arranged equally in the circumferential direction. The second system first output winding 111B and the second system second output winding 112B are distributed and wound around each teeth of the second system stator 13B so that the amplitudes of those induced AC voltages are mutually different 90 degrees in the electrical angle. The second system excitation winding 10B is distributed and wound around each teeth of the second system stator 13B. The teeth number of the first system stator 13A and the teeth number of the second system stator 13B may be the same numbers, or may be the different numbers.

Even using the configuration of this kind resolver 1, by performing the similar processing as the controller 50 of Embodiment 1 or 2, even if the magnetic interference between systems occurs, the first angle θ1, the second angle θ2, the first system square sum V1_amp and the second system square sum V2_amp are detected with good accuracy.

4. Other Embodiments

Lastly, other embodiments of the present disclosure will be explained. Each of the configurations of embodiments to be explained below is not limited to be separately utilized but can be utilized in combination with the configurations of other embodiments as long as no discrepancy occurs.

(1) The first system and the second system may be replaced. That is to say, the first system of each of above embodiments may be set to the second system; and the second system of each of above embodiments may be set to the first system.

(2) In each of the above-mentioned embodiments, there was explained the case where the abnormality of first system is determined based on the first system square sum V1_amp, and the abnormality of second system is determined based on the second system square sum V2_amp. However, embodiments of the present disclosure are not limited to the foregoing case. That is to say, the abnormality of first system may be determined based on a square root of first system square sum V1_amp, and the abnormality of second system may be determined based on a square root of the second system square sum V2_amp.

(3) In each of the above-mentioned embodiments, there was explained the case where the first system reduction processing unit 53A performs the addition processing of this time detection value and the detection value before the first system reduction processing interval $\Delta T1$, as the second period component reduction processing which reduces the component of the second period included in the detection values of output signals of first system two output windings; and the second system reduction processing unit 53B performs the subtraction processing or the addition processing of this time detection value and the detection value before the second system reduction processing interval $\Delta T2$, as the first period component reduction processing which reduces the component of the first period included in the detection values of output signals of second system two output windings. However, embodiments of the present disclosure are not limited to the foregoing case. That is to say, the first system reduction processing unit 53A may perform a band reduction filter processing such as a high pass filter processing or a band stop filter processing which reduces the component of the second period, as the second period component reduction processing. The second system reduction processing unit 53B may perform a band reduction filter processing such as a low pass filter processing or a band stop filter processing which reduces the component of the first period, as the first period component reduction processing.

(4) In each of the above-mentioned Embodiments, there been explained the case where the one controller 50 is provided with the processing units 51A to 56A of the first system, and the processing units 51B to 56B of the second system. However, embodiments of the present disclosure are not limited to the foregoing case. That is to say, a controller of the first system may be provided with the processing units 51A to 56A of the first system, and a controller of the second system may be provided with the processing units 51B to 56B of the second system, or a plurality of controllers may be distributedly provided with each processing units 51A to 56B of the first system and the second system.

(5) In each of the above-mentioned embodiments, there was explained the case where the first system output signal detection unit 52A detects the output signals of first system two output windings V1A, V2A at every the first period TA when the excitation AC voltage VRA becomes the maximum value. However, embodiments of the present disclosure are not limited to the foregoing case. That is to say, the first system output signal detection unit 52A may detect the output signals of first system two output windings V1A, V2A at every the first period TA when the excitation AC voltage VRA becomes the minimum value, or may detect at every the first period TA when the excitation AC voltage VRA becomes other than the maximum value and the minimum value as mentioned above. Alternatively, the first system output signal detection unit 52A may detect at every the half period TA/2 of the first period when the excitation AC voltage VRA becomes the maximum value or the minimum value. Alternatively, the first system output signal detection unit 52A may the detect output signals of first system two output windings V1A, V2A at every period (for example, a period obtained by dividing the first system reduction processing interval $\Delta T1$ by an integer greater than or equal to one) which is different from the first period TA and the half period TA/2 of the first period. Also in these cases, the first delay device 53A1 and the second delay device 53A2 of the first system reduction processing unit 53A delays the input signal by the first system reduction processing interval $\Delta T1$ and outputs.

(6) In above-mentioned Embodiment 1, there was explained the case where the second system output signal detection unit 52B detects the output signals of second system two output windings V1B, V2B at every the half period TB/2 of the second period when the excitation AC voltage VRB becomes the maximum value or the minimum value. However, embodiments of the present disclosure are not limited to the foregoing case. That is to say, as mentioned above, the second system output signal detection unit 52B may detect at every half period TB/2 of the second period when the excitation AC voltage VRB becomes other than the maximum value and the minimum value. Alternatively, the second system output signal detection unit 52B may the detect output signals of second system two output windings V1B, V2B at every period (for example, a period obtained by dividing the second system reduction processing interval $\Delta T2$ by an integer greater than or equal to one) which is different from the half period TB/2 of the second period. Also in these cases, the first delay device 53B1 and the second delay device 53B2 of the second system reduction processing unit 53B delays the input signal by the second system reduction processing interval $\Delta T2$ and outputs.

(7) In above-mentioned Embodiment 2, there was explained the case where the second system output signal detection unit 52B detects the output signals V1B, V2B of the second system two output windings at every 1/4 period TA/4 of the first period; and each detection timing is set so as to become before-and-after symmetrical with respect to the reference timing TM0 when the AC voltage VRB of the second period TB becomes the maximum value or the minimum value. However, embodiments of the present disclosure are not limited to the foregoing case. That is to say, the second system output signal detection unit 52B may detect periodically the output signals V1B, V2B of the second system two output windings at two timings which become before-and-after symmetrical with respect to a reference timing TM0 when the excitation AC voltage VRB becomes the maximum value. Alternatively, the second system output signal detection unit 52B may detect periodically the output signals V1B, V2B of the second system two output windings at two timings which become before-and-after symmetrical with respect to a reference timing TM0 when the excitation AC voltage VRB becomes the minimum value. As long as the interval between two timings which become before-and-after symmetry is set to the second system reduction processing interval $\Delta T2$, it may be set to an interval other than 1/4 period TB/4 of the second period. Also in these cases, the first delay device 53B1 and the second delay device 53B2 of the second system reduction processing unit 53B may delay the input signal by the second system reduction processing interval $\Delta T2$ and output; and the second system reduction processing unit 53B may perform the addition processing at the later timing TM2 with respect to the reference timing TM0 and calculate the detection values of output signals of second system two output windings V1B_F, V2B_F after addition.

(8) As the angle detection apparatus for a motor which is provided with two sets of three-phase windings and inverters, the angle detection apparatus according to the present disclosure may be used. This kind of dual system motor is provided in an electric power steering apparatus, for example. The configuration of the first system of the angle detection apparatus of the present disclosure is assigned to the control system of the first set of three-phase winding and inverter, and the first angle $\theta 1$ is used for it. The configuration of the second system of the angle detection apparatus of the present disclosure is assigned to the control system of the second set of three-phase winding and inverter, and the second angle 02 is used for it. Then, when the abnormality of first system of the angle detection apparatus is detected, control of the first set of three-phase winding and inverter is stopped. When the abnormality of second system of the angle detection apparatus is detected, control of the second set of three-phase winding and inverter is stopped. Since it is not necessary to synchronize the first system and the second system in the angle detection apparatus of the present disclosure, it may be configure that the first set of three-phase winding and inverter, and the first system of angle detection apparatus are controlled by a first controller (CPU), and the second set of three-phase winding and inverter, and the second system of angle detection apparatus are controlled by a second controller (CPU). Accordingly, system including the angle detection apparatus can be made redundant, and reliability can be improved.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

REFERENCE SIGNS LIST

1 Resolver, 10A First system excitation winding, 10B Second system excitation winding, 111A, 112A First system two output windings, 111B, 112B Second system two output windings, 51A First system excitation unit, 52A First system output signal detection unit, 53A First system reduction processing unit, 54A First system angle calculation unit, 55A First system square sum calculation unit, 56A First system abnormality detection unit, 51B Second system excitation unit, 52B Second system output signal detection unit, 53B Second system reduction processing unit, 54B Second system angle calculation unit, 55B Second system square sum calculation unit, 56B Second system abnormality detection unit, TA First period, TB Second period, V1_amp First system square sum, V2_amp Second system square sum, $\Delta T1$ First system reduction processing interval, $\Delta T2$ Second system reduction processing interval, V1A_S, V2A_S Detection values of the first system two output signals, V1A_F, V2A_F Detection values of the first system two output signals after the second period component reduction processing, V1A_TA, V2A_TA Components of the first period included in the output signals of first system two output windings, V1A_TB, V2A_TB Components of the second period included in the output signals of first system two output windings, V1B_S, V2B_S Detection values of the second system two output signals, V1B_F, V2B_F Detection values of the second system two output signals after the first period component reduction processing, V1B_TA, V2B_TA Components of the first period included in the output signals of second system two output windings, V1B_TB, V2B_TB Components of the second period included in the output signals of second system two output windings

What is claimed is:

1. An abnormality detection apparatus for resolver comprising:
   a resolver that is provided with a first system excitation winding, first system two output windings, a second system excitation winding, and second system two output windings;
   a first system exciter configured to apply AC voltage of a first period to the first system excitation winding;
   a second system exciter configured to apply the AC voltage of a second period different from the first period, to the second system excitation winding;+
   a first system output signal detector configured to detect periodically output signals of the first system two output windings at preliminarily set detection timing;
   a first system reduction processor configured to perform a second period component reduction processing which arithmetically reduces a value of a component of the second period, to detection values of the output signals of the first system two output windings;
   a first system square sum calculator configured to calculate a first system square sum which is a sum of square values of the detection values of output signals of first system two output windings after the second period component reduction processing, based on values obtained by arithmetically reducing the value of the component of the second period from the detection values of the output signals of the first system two output windings; and
   a first system abnormality detector configured to determine abnormality of first system, based on whether or not the first system square sum is within a preliminarily set normal range of first system,
   wherein the second period is set longer than the first period,
   wherein the first system reduction processor, as the second period component reduction processing, is further configured to add the detection values of output signals of first system two output windings detected at this time detection timing, and the detection values of output signals of first system two output windings detected at the detection timing earlier by a first system reduction processing interval than this time detection timing,
   wherein when setting the second period to TB, the first system reduction processing interval is set to TB/2+TB×M (M is an integer greater than or equal to 0), and
   wherein the first system square sum calculator is further configured to calculate the first system square sum which is a sum of square values of the detection values of output signals of first system two output windings after addition.

2. The abnormality detection apparatus for resolver according to claim 1,
   wherein, when a case where the first system square sum is not within the normal range of first system occurs continuously a preliminarily set abnormality determination frequency or more, the first system abnormality detector determines that abnormality occurs in the first system.

3. The abnormality detection apparatus for resolver according to claim 1,
   wherein when setting the first period to TA, the second period is set to TA×2×N (N is greater than or equal to 1).

4. The abnormality detection apparatus for resolver according to claim 1,
wherein the first system output signal-detector is further configured to detect the output signals of the first system two output windings at a timing when the AC voltage of the first period applied to the first system excitation winding becomes a maximum value or a minimum value.

5. The abnormality detection apparatus for resolver according to claim 1,
wherein the first system excitation winding, the first system two output windings, the second system excitation winding, and the second system two output windings are wound around the same one stator.

6. The abnormality detection apparatus for resolver according to claim 1,
wherein the first system excitation winding and the first system two output windings are wound around a first system stator; and the second system excitation winding and the second system two output windings are wound around a second system stator which adjoins the first system stator in an axial direction.

7. An abnormality detection apparatus for resolver comprising:
a resolver that is provided with a first system excitation winding, first system two output windings, a second system excitation winding, and second system two output windings;
a first system exciter configured to apply AC voltage of a first period to the first system excitation winding;
a second system exciter configured to apply the AC voltage of a second period different from the first period, to the second system excitation winding;+
a first system output signal detector configured to detect periodically output signals of the first system two output windings at preliminarily set detection timing;
a first system reduction processor configured to perform a second period component reduction processing which arithmetically reduces a value of a component of the second period, to detection values of the output signals of the first system two output windings;
a first system square sum calculator configured to calculate a first system square sum which is a sum of square values of the detection values of output signals of first system two output windings after the second period component reduction processing, based on values obtained by arithmetically reducing the value of the component of the second period from the detection values of the output signals of the first system two output windings;
a first system abnormality detector configured to determine abnormality of first system, based on whether or not the first system square sum is within a preliminarily set normal range of first system;
a second system output signal detector configured to detect periodically output signals of the second system two output windings at preliminarily set detection timing;
a second system reduction processor configured to perform a first period component reduction processing which arithmetically reduces a value of a component of the first period, to detection values of the output signals of second system two output windings; and
a second system square sum calculator configured to calculate a second system square sum which is a sum of square values of the detection values of output signal of second system two output windings after the first period component reduction processing; and
a second system abnormality detector configured to determine abnormality of second system, based on whether or not the second system square sum is within a preliminarily set normal range of second system,
wherein the second system reduction processor is further configured to perform, as the first period component reduction processing, a subtraction processing which calculates differences between the detection values of output signal of second system two output windings detected at this time detection timing and the detection values of output signal of second system two output windings detected at the detection timing earlier by a second system reduction processing interval than this time detection timing,
wherein when setting the first period to TA, the second system reduction processing interval is set to TA×P (P is an integer greater than or equal to 1), and
wherein the second system square sum calculator is further configured to calculate the second system square sum which is a sum of square values of the detection values of output signals of second system two output windings after subtraction processing.

8. The abnormality detection apparatus for resolver according to claim 7,
wherein, when a case where the second system square sum is not within the normal range of second system occurs continuously a preliminarily set abnormality determination frequency or more, the second system abnormality detector determines that abnormality occurs in the second system.

9. The abnormality detection apparatus for resolver according to claim 7,
wherein when setting the first period to TA, the second period is set to TA×2×N (N is greater than or equal to 1); and
wherein when setting the second period to TB, the second system reduction processing interval is set to TB/2+TB×L (L is an integer greater than or equal to 0).

10. An abnormality detection apparatus for resolver comprising:
a resolver that is provided with a first system excitation winding, first system two output windings, a second system excitation winding, and second system two output windings;
a first system exciter configured to apply AC voltage of a first period to the first system excitation winding;
a second system exciter configured to apply the AC voltage of a second period different from the first period, to the second system excitation winding; +
a first system output signal detector configured to detect periodically output signals of the first system two output windings at preliminarily set detection timing;
a first system reduction processor configured to perform a second period component reduction processing which arithmetically reduces a value of a component of the second period, to detection values of the output signals of the first system two output windings;
a first system square sum calculator configured to calculate a first system square sum which is a sum of square values of the detection values of output signals of first system two output windings after the second period component reduction processing, based on values obtained by arithmetically reducing the value of the component of the second period from the detection values of the output signals of the first system two output windings;
a first system abnormality detector configured to determine abnormality of first system, based on whether or not the first system square sum is within a preliminarily set normal range of first system;
a second system output signal detector configured to detect periodically output signals of the second system two output windings at preliminarily set detection timing;
a second system reduction processor configured to perform a first period component reduction processing which arithmetically reduces a value of a component of the first period, to detection values of the output signals of second system two output windings; and
a second system square sum calculator configured to calculate a second system square sum which is a sum of square values of the detection values of output signal of second system two output windings after the first period component reduction processing; and
a second system abnormality detector configured to determine abnormality of second system, based on whether or not the second system square sum is within a preliminarily set normal range of second system,
wherein the second system reduction processor is further configured to, as the first period component reduction processing, add the detection values of output signals of second system two output windings detected at this time detection timing, and the detection values of output signals of second system two output windings detected at the detection timing earlier by a second system reduction processing interval than this time detection timing,
wherein the second system square sum calculator is further configured to calculate the second system square sum which is a sum of square values of the detection values of output signals of second system two output windings after addition, and
wherein when setting the first period to TA, the second system reduction processing interval is set to TA/2+ TA×X (X is an integer greater than or equal to 0).

11. The abnormality detection apparatus for resolver according to claim 10,
wherein the second system output signal detector is further configured to detect periodically the output signals of second system two output windings at two timings which become before-and-after symmetrical with respect to a reference timing when the AC voltage of the second period applied to the second system excitation winding becomes the maximum value or the minimum value,
wherein an interval of the two timings is set to the second system reduction processing interval, and
wherein the second system reduction processor is further configured to add the detection values of output signal of second system two output windings detected at the two timings with each other.

12. The abnormality detection apparatus for resolver according to claim 7,
wherein the second system output signal detector is configured to detect the output signals of the second system two output windings at a timing when the AC voltage of the second period applied to the second system excitation winding becomes a maximum value or a minimum value.

* * * * *